(12) United States Patent
Shinohara

(10) Patent No.: US 7,910,226 B2
(45) Date of Patent: Mar. 22, 2011

(54) POROUS SEMICONDUCTOR LAYER FORMATION MATERIAL

(75) Inventor: Yuji Shinohara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 603 days.

(21) Appl. No.: 11/918,431

(22) PCT Filed: Apr. 14, 2006

(86) PCT No.: PCT/JP2006/308366
§ 371 (c)(1),
(2), (4) Date: Oct. 12, 2007

(87) PCT Pub. No.: WO2006/112514
PCT Pub. Date: Oct. 26, 2006

(65) Prior Publication Data
US 2009/0140635 A1    Jun. 4, 2009

(30) Foreign Application Priority Data

Apr. 15, 2005  (JP) ................................. 2005-117868

(51) Int. Cl.
*H01J 1/63* (2006.01)

(52) U.S. Cl. .......................... 428/690; 313/504; 544/165

(58) Field of Classification Search ........................ None
See application file for complete search history.

(56) References Cited

U.S. PATENT DOCUMENTS

| | | |
|---|---|---|
| 4,801,517 A | 1/1989 | Frechet et al. |
| 6,811,896 B2 * | 11/2004 | Aziz et al. ..................... 428/690 |
| 2002/0053871 A1 * | 5/2002 | Seo ................................ 313/504 |
| 2005/0045874 A1 * | 3/2005 | Xiao et al. ...................... 257/40 |
| 2006/0029870 A1 * | 2/2006 | Nukada et al. ................. 430/56 |

FOREIGN PATENT DOCUMENTS

| | | |
|---|---|---|
| EP | 1 107 332 A2 | 6/2001 |
| JP | A-09-255774 | 9/1997 |
| JP | A-10-069981 | 3/1998 |
| JP | A-2000-208254 | 7/2000 |

OTHER PUBLICATIONS

Zhang et. al., Role of Particle Size . . . TiO2, 1998, J. Phys. Chem. B., vol. 102, p. 10871-10878.*

(Continued)

*Primary Examiner* — D. Lawrence Tarazano
*Assistant Examiner* — Gregory Clark
(74) *Attorney, Agent, or Firm* — Oliff & Berridge, PLC

(57) ABSTRACT

The object of the present invention is to provide a semiconductor layer formation material from which a semiconductor layer having a high carrier transport ability can be made, a method of forming a semiconductor element having a semiconductor layer having a high carrier transport ability, a semiconductor element formed by the semiconductor element manufacturing method, an electronic device provided with the semiconductor element, and electronic equipment having a high reliability. The semiconductor layer formation material includes a semiconductor material, porous particles each having a number of pores, and a dispersion medium, wherein the semiconductor material is existed in the semiconductor layer formation material in such a state that at least a part of the semiconductor material is filled in the pores of the porous particles. According to the semiconductor layer formation material it is possible to form a semiconductor layer having a high carrier transport ability can be made.

16 Claims, 6 Drawing Sheets

OTHER PUBLICATIONS

Rubio et. al., Charact . . . titanium dioxide spherical particle, 1997, J. of Material Science, vol. 32, p. 643-652.*

Peng et al., "Enhanced coupling of light from organic light emitting diodes using nanoporous films." *Journal of Applied Physics*, vol. 96, No. 3, Aug. 1, 2004, p. 1649-1654.

Zhang et al., "Photo-crosslinkable polymers as hole-transport materials for organic light-emitting diodes." *Journal of Materials Chemistry*, vol. 12, May 3, 2002, p. 1703-1708.

Coakley et al., "Enhanced Hole Mobility in Regioregular Polythiophene Infiltrated in Straight Nanopores." *Advanced Functional Materials*, vol. 15, No. 12, Oct. 31, 2005, p. 1927-1932.

* cited by examiner

POROUS SEMICONDUCTOR LAYER FORMATION MATERIAL

CROSS-REFERENCE TO RELATED APPLICATION

This application claims a priority to Japanese Patent Application No. 2005-117868 filed on Apr. 15, 2005 which is hereby expressly incorporated by reference herein in its entirety.

BACKGROUND OF THE INVENTION

1. Field of the Invention

The present invention relates to a semiconductor layer formation material, a method of forming a semiconductor element, a semiconductor element, an electronic device, and electronic equipment, and more particularly relates to a semiconductor layer formation material, a method of forming a semiconductor element using the semiconductor layer formation material, a semiconductor element formed by the method, an electronic device provided with the semiconductor element, and electronic equipment provided with the electronic device.

2. Description of the Prior Art

As a semiconductor element having a plurality of organic layers, there are known an organic electroluminescent device (hereinafter, simply referred to as an "organic EL device") and an organic thin film transistor and the like.

In particular, the organic EL devices have been extensively developed in expectation of their use as solid-state luminescent devices or emitting devices for use in inexpensive large full-color displays.

In general, such an organic EL device has a structure in which a light emitting layer is provided between a cathode and an anode. When an electric field is applied between the cathode and the anode, electrons are injected into the light emitting layer from the cathode side, and holes are injected into the light emitting layer from the anode side.

The injected electrons and holes are recombined in the light emitting layer, which then causes their energy level to return from the conduction band to the valence band. At this time, excitation energy is released as light energy so that the light emitting layer emits light.

In such organic EL devices, it has been known that a layered device structure, in which organic layers formed of organic materials having different carrier transport properties for electrons or holes are provided between a light emitting layer and a cathode and/or an anode, is effective in obtaining a high-efficiency organic EL device with high luminance.

For this purpose, it is necessary to laminate a light emitting layer and organic layers having different carrier transport properties (hereinafter, these layers are collectively referred to as "organic layers") on the electrode. However, in the conventional manufacturing method using an application method, when such organic layers are laminated, mutual dissolution occurs between the adjacent organic layers, thereby causing the problem of deterioration in the light emitting efficiency of a resultant organic EL device, the color purity of emitted light, and/or the pattern precision.

For this reason, in the case where organic layers are laminated, these organic layers have to be formed using organic materials having different solubilities.

In order to solve such a problem, a method for improving the durability of a lower organic layer, that is, the solvent resistance of the lower organic layer has been disclosed (see, for example, Japanese Patent Laid-open No. Hei 9-255774).

In this method, organic materials constituting the lower organic layer are polymerized to improve the solvent resistance of the lower organic layer.

Another method for improving the solvent resistance of a lower organic layer is found in JP-A No. 2000-208254. This publication discloses a method in which a curing resin is added to an organic material constituting the lower organic layer to cure the organic material together with the curing resin.

However, even in the case where such a method is employed in manufacturing an organic EL device, the characteristics of the resultant organic EL device are not so improved as to meet expectations in actuality.

The problem described above has also been raised in thin film transistors using organic materials.

SUMMARY OF THE INVENTION

It is therefore an object of the present invention to provide a semiconductor layer formation material from which a semiconductor layer having a high carrier transport ability can be made. Another object of the present invention is to provide a method of manufacturing a semiconductor element provided with a semiconductor layer having a high carrier transport ability. Further, the other object of the present invention is to provide a semiconductor element formed by the semiconductor element manufacturing method. Still other object of the present invention is to provide an electronic device provided with the semiconductor element, and electronic equipment having high reliability.

In order to achieve the above objects, the present invention is directed to a semiconductor layer formation material comprising a semiconductor material, porous particles each having a number of pores, and a dispersion medium, wherein the semiconductor material is existed in the semiconductor layer formation material in such a state that a part of the semiconductor material is filled in the pores of the porous particles.

According to the present invention described above, it is possible to provide a semiconductor layer formation material from which a semiconductor layer having a high carrier transport ability can be made.

In the semiconductor layer formation material according to the present invention, it is preferred that when the amount of the porous particles contained in the semiconductor layer formation material is defined as A wt % and the amount of the semiconductor material contained in the semiconductor layer formation material is defined as B wt %, the value A/B satisfies the relation of 1 to 9.

By satisfying the above relation, it is possible to fill the pores and the gaps with the semiconductor material so that the semiconductor material is carried by the pores and the gaps reliably in the semiconductor layer to be formed.

In the semiconductor layer formation material according to the present invention, it is also preferred that the porosity of the porous particles is in the range of 20 to 75%.

This makes it possible to fill the pores of the porous particles with more amount of the semiconductor material while preventing the mechanical strength of the porous particles from being lowered.

Further, in the semiconductor layer formation material according to the present invention, it is also preferred that each of the porous particles is formed into a spherical shape or a polyhedron.

By selecting porous particles having such a shape, it is possible to reduce the ratio occupied by the gaps in the hole transport layer while making it possible to increase the contact area between the porous particles.

Further, in the semiconductor layer formation material according to the present invention, it is also preferred that an average particle size of the porous particles is in the range of 2 to 200 nm.

This also makes it possible to reduce the ratio occupied by the gaps in the semiconductor layer.

Further, in the semiconductor layer formation material according to the present invention, it is also preferred that the porous particles are mainly composed of inorganic oxides.

This makes it possible to more easily obtain porous particles having pores which are formed from a constituent material that does not decrease a carrier transport ability of the semiconductor material in a semiconductor layer to be formed.

Furthermore, in the semiconductor layer formation material according to the present invention, it is preferred that the inorganic oxides include at least one or more of $SiO_2$, $Al_2O_3$, $ZnO$, $SnO_2$, $CeO_2$, ITO, $TiO_2$, CuO, $Fe_2O_3$, CoO, and $Y_2O_3$.

This also makes it possible to more easily obtain porous particles having pores which are formed from a constituent material that does not decrease a carrier transport ability of the semiconductor material in a semiconductor layer to be formed.

Furthermore, in the semiconductor layer formation material according to the present invention, it is preferred that the semiconductor material is comprised of a compound having at least one polymerizable group.

By using such a material, it is possible to polymerize the semiconductor material by polymerizing the compounds at their polymerizable groups. As a result, such a polymerized semiconductor material is firmly carried by the porous particles.

Moreover, in the semiconductor layer formation material according to the present invention, it is preferred that the compound is represented by the following general formula (A1) or (A2), and the compound can be polymerized via its polymerizable groups:

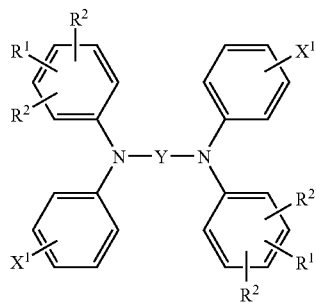

(A1)

wherein two $R^1$s are the same or different and each independently represents a straight-chain alkyl group having 2 to 8 carbon atoms, four $R^2$s are the same or different and each independently represents a hydrogen atom, a methyl group or an ethyl group, Y represents a group containing at least one substituted or unsubstituted aromatic hydrocarbon ring or substituted or unsubstituted heterocycle, and two $X^1$s are the same kind of substituent represented by any one of the following general formulas (B1) to (B3), in which the number of carbon atoms of the two $X^1$s are the same as or different from to each other; or

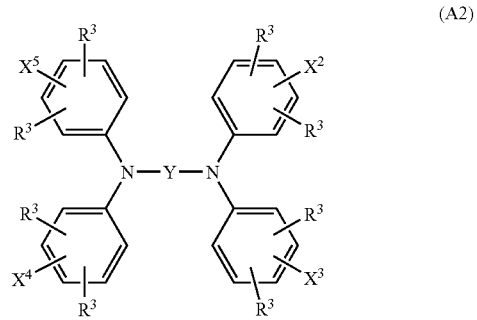

(A2)

wherein eight $R^3$s are the same or different and each independently represents a hydrogen atom, a methyl group, or an ethyl group, Y represents a group containing at least one substituted or unsubstituted aromatic hydrocarbon ring or substituted or unsubstituted heterocycle, and $X^2$, $X^3$, $X^4$ and $X^5$s are the same kind of substituent which is represented by any one of the following general formulas (B1) to (B3), in which the number of carbon atoms of $X^2$, $X^3$, $X^4$ and $X^5$ are the same as or different from each other.

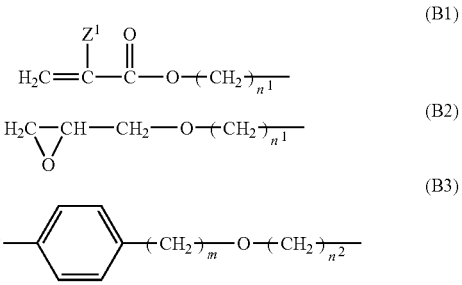

wherein $n^1$ is an integer of 2 to 8, $n^2$ is an integer of 3 to 8, m is an integer of 0 to 3, $Z^1$ represents a hydrogen atom or a methyl group, and $Z^2$ represents a hydrogen atom, a methyl group or an ethyl group.

By using such a compound, it is possible to polymerize the semiconductor material by polymerizing the compounds at their substituents. As a result, such a polymerized semiconductor material can be firmly carried by the porous particles.

Another aspect of the present invention is directed to a method of producing a semiconductor element. The method comprises a step of forming a semiconductor layer on one surface of a first electrode; and a step of forming a second electrode on a surface of the semiconductor layer which is opposite to the first electrode; wherein the semiconductor layer forming step includes a step of forming a liquid coating layer by supplying a semiconductor layer formation material which comprises a semiconductor material, porous particles and a dispersion medium and in which the semiconductor material is existed in such a state that at least a part of the semiconductor material is filled in the pores of the porous particles; and a step of removing the dispersion medium from the liquid coating layer.

According to the semiconductor element producing method, it is possible to produce a semiconductor element which includes a semiconductor layer having an excellent carrier transport ability.

In the above semiconductor element producing method, it is preferred that the semiconductor material is comprised of a compound having at least one polymerizable group, and wherein the semiconductor element producing method further comprises after the dispersion medium removable step a step of polymerizing the compounds through their polymerizable groups.

The other aspect of the present invention is also directed to a method of manufacturing a semiconductor element. The method comprises: a step of forming a semiconductor layer on one surface of a first electrode; and a step of forming a second electrode on a surface of the semiconductor layer which is opposite to the first electrode; wherein the semiconductor layer forming step includes a step of supplying a liquid material which comprises a semiconductor material and a solvent or a dispersion medium to porous particles which are deposited in a coating state so that the semiconductor material is filled in pores of the porous particles and gaps among the porous particles; and a step of removing the dispersion medium or solvent from the liquid material.

According to the semiconductor element producing method, it is also possible to produce a semiconductor element which includes a semiconductor layer having an excellent carrier transport ability.

In the above semiconductor element producing method, it is preferred that the semiconductor material is comprised of a compound having at least one polymerizable group, and wherein the semiconductor element manufacturing method further comprises after the dispersion medium removable step a step of polymerizing the compounds through their polymerizable groups.

Other aspect of the present invention is directed to a semiconductor element which comprises a first electrode, a second electrode, and a semiconductor layer, wherein the semiconductor layer comprises porous particles and a semiconductor material filled in pores of the porous particles and gaps among the porous particles, and the semiconductor layer being provided between the first electrode and the second electrode.

The semiconductor element exhibits an excellent carrier transport ability due to the provision of the semiconductor layer having the above structure.

In the above semiconductor element, it is preferred that the semiconductor layer includes a hole transport layer. Such a hole transport layer can exhibit an excellent hole transport ability.

Further, it is also preferred that the semiconductor layer includes a light emitting layer. Such a light emitting layer can exhibit an excellent electron transport ability.

Still other aspect of the present invention is directed to an electronic device provided with the semiconductor element mentioned above. Such an electronic device can have a high reliability.

Yet other aspect of the present invention is directed to electronic equipment provided with the electronic device mentioned above. Such electronic equipment can also have high reliability.

BEST MODE FOR CARRYING OUT THE INVENTION

Hereinbelow, a semiconductor layer formation material, a method of forming a semiconductor element, a semiconductor element, an electronic device, and electronic equipment according to the present invention will be described in detail with reference to preferred embodiments shown in the accompanying drawings.

It is to be noted that the following description will be made with regard to one representative case where the semiconductor element of the present invention is embodied as an organic electroluminescent device (hereinafter, simply referred to as "EL device" or "EL element").

<<EL Device>>

First Embodiment

Figure 1:
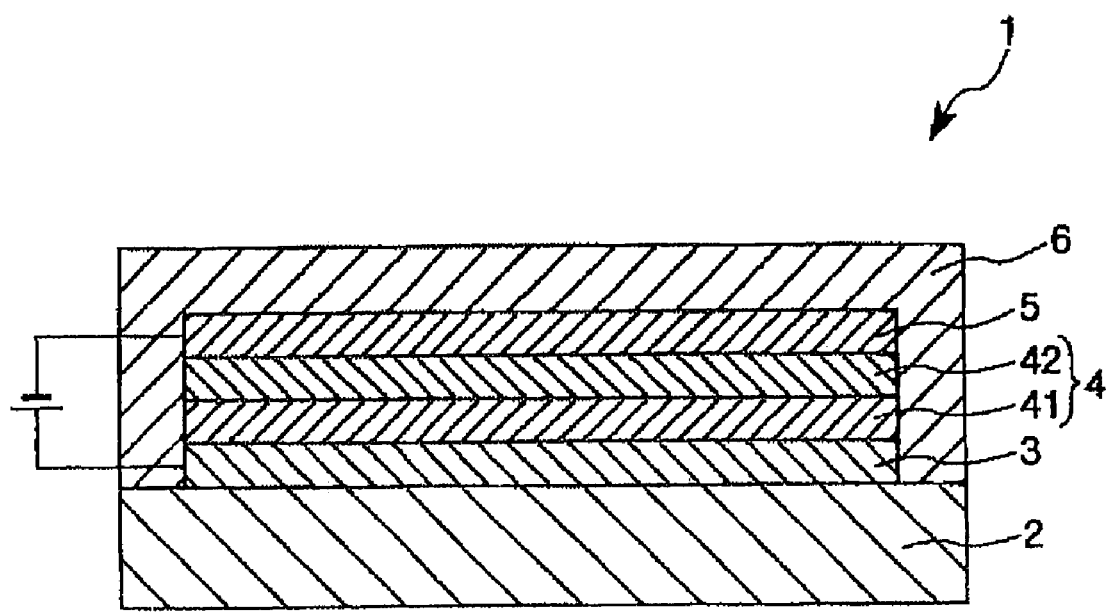
FIG. 1 is a cross-sectional view which shows a first embodiment of a semiconductor element according to the present invention, which is directed to a case where the semiconductor element is applied to an EL device.
Figure 2:
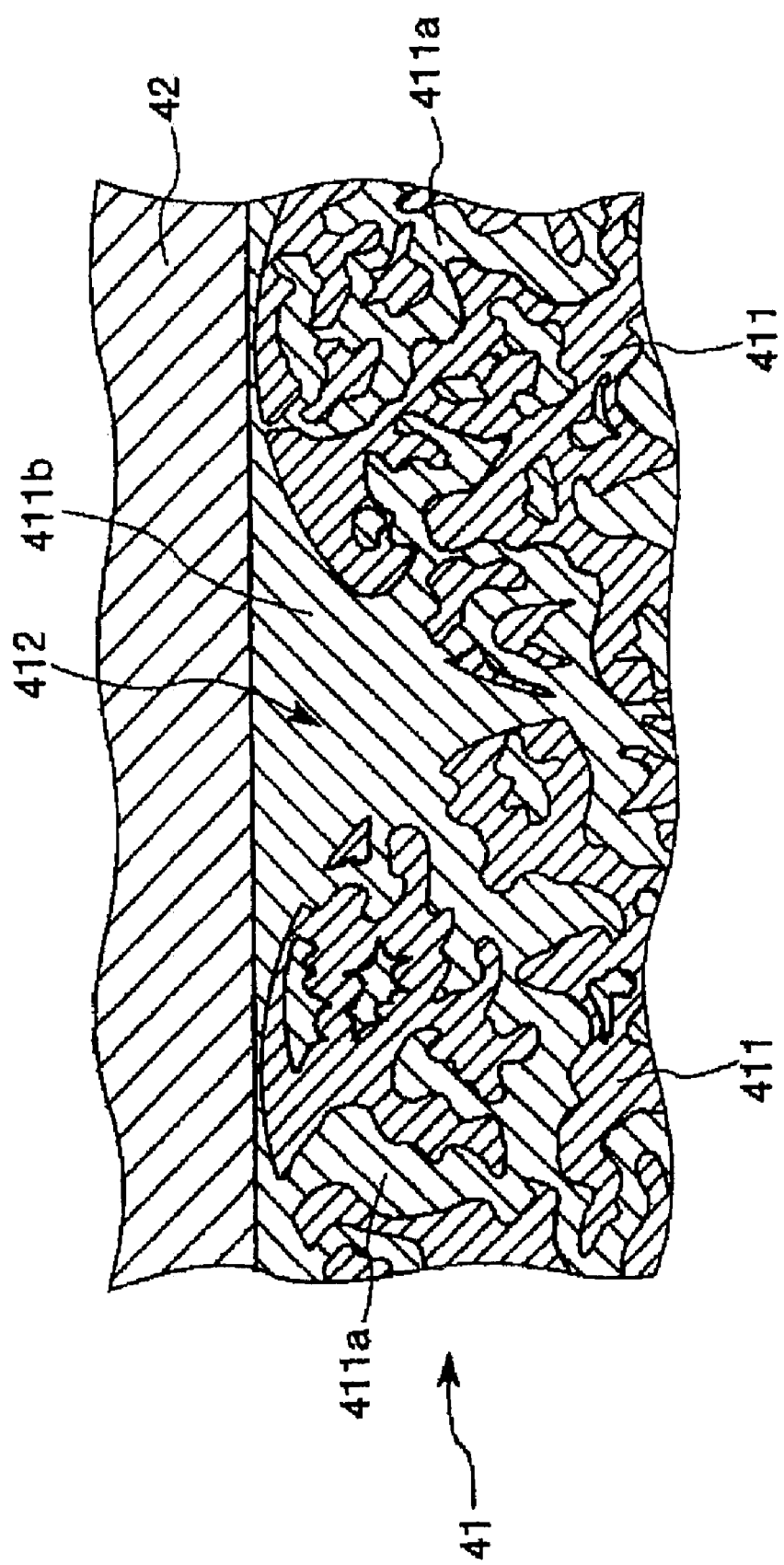
FIG. 2 is an enlarged cross-sectional view of a part which is in the vicinity of a boundary between a hole transport layer and a luminescent layer of the EL device shown in FIG. 1.

FIG. 1 is a cross-sectional view which shows a first embodiment of an EL device to which the present invention is applied; and FIG. 2 is an enlarged cross-sectional view of a part which is in the vicinity of a boundary between a hole transport layer and a luminescent layer of the EL device shown in FIG. 1.

In the following description, the upper side in FIG. 2 will be referred to as "upper" or "upper side" and the lower side thereof will be referred to as "lower" or "lower side".

The EL device 1 shown in FIG. 1 includes a transparent substrate 2, an anode 3 provided on the substrate 2, an EL layer 4 (including a hole transport layer 41 and a light emitting layer 42) provided on the anode 3, a cathode 5 provided on the EL layer 4 and a protection layer 6 provided so as to cover these layers 3, 4 and 5.

The substrate 2 serves as a support for the EL device 1, and the layers described above are formed on the substrate 2.

As a constituent material of the substrate 2, a material having a light-transmitting property and a good optical property can be used.

Examples of such a material include various resins such as polyethylene terephthalate, polyethylene naphthalate, polypropylene, cycloolefin polymer, polyamide, polyethersulfone, polymethylmethacrylate, polycarbonate, and polyarylate, and various glass materials, and the like. At least one of these materials can be used as a constituent material of the substrate 2.

The average thickness of the substrate 2 is not particularly limited, but is preferably in the range of about 0.1 to 30 mm, and more preferably in the range of about 0.1 to 10 mm.

The anode 3 is an electrode which injects holes into the EL layer 4 (that is, into a hole transport layer 41 described later). This anode 3 is made substantially transparent (which includes transparent and colorless, colored and transparent, or translucent) so that light emission from the EL layer 4 (that is, from a light emitting layer 42 described later) can be visually identified.

From such a viewpoint, a material having a high work function, excellent conductivity, and a light transmitting property is preferably used as the constituent material of the anode 3 (hereinafter, referred to as "anode material").

Examples of such an anode material include oxides such as ITO (Indium Tin Oxide), $SnO_2$, Sb-containing $SnO_2$, and Al-containing ZnO, Au, Pt, Ag, Cu, and alloys containing two or more of them. At least one of these materials can be used as an anode material.

The average thickness of the anode 3 is not limited to any specific value, but is preferably in the range of about 10 to 200 nm, and more preferably in the range of about 50 to 150 nm. If the thickness of the anode 3 is too thin, there is a case that a function of the anode 3 will not be sufficiently exhibited. On the other hand, if the anode 3 is too thick, there is a case that the light transmittance will be significantly lowered depending on, for example, the kind of anode material used, thus resulting in an EL device that is not suitable for practical use.

It is to be noted that conductive resins such as polythiophene, polypyrrole, and the like can also be used as the anode material.

On the other hand, the cathode 5 is an electrode which injects electrons into the organic EL layer 4 (that is, into an electron transport layer 43 described later).

As a constituent material of the cathode 5 (hereinafter, referred to as "cathode material"), a material having a low work function is preferably used.

Examples of such a cathode material include Li, Mg, Ca, Sr, La, Ce, Er, Eu, Sc, Y, Yb, Ag, Cu, Al, Cs, Rb, and alloys containing two or more of them. At least one of these materials can be used as a cathode material.

Particularly, in the case where an alloy is used as a cathode material, an alloy containing a stable metallic element such as Ag, Al, or Cu, specifically an alloy such as MgAg, AlLi, or CuLi is preferably used. The use of such an alloy as a cathode material makes it possible to improve the electron injection efficiency and stability of the cathode 5.

The average thickness of the cathode 5 is preferably in the range of about 1 nm to 1 μm, and more preferably in the range of about 100 to 400 nm. If the thickness of the cathode 5 is too thin, there is a case that a function of the cathode 5 will not be sufficiently exhibited. On the other hand, if the cathode 5 is too thick, there is a case that the light emitting efficiency of the EL device 1 will be lowered.

The EL layer 4 is provided between the anode 3 and the cathode 5. The EL layer 4 includes the hole transport layer 41, the light emitting layer 42, and the electron transport layer 43. These layers 41, 42 and 43 are formed on the anode 3 in this order.

The hole transport layer 41 has a function of transporting holes, which are injected from the anode 3, to the light emitting layer 42.

In this embodiment, the hole transport layer 41 is comprised of porous particles 411 and a hole transport material (a semiconductor material) which is filled in pores 411a of the porous particles 411 and gaps 411b among the porous particles 411 (See FIG. 2).

By forming the hole transport layer 41 so as to have such a structure, that is a structure having the pores 411a and the gaps 411b, it is possible to reliably prevent continuing linkage (continuous form) of the hole transport materiel 412 in the hole transport layer 41 from being blocked by the porous particles 411. As a result, it is possible to reliably prevent the hole transport ability of the hole transport layer from being decreased.

The hole transport material 412 is carried by the porous particles 411 through the areas which are in contact with the surfaces of the porous particles 411, that is the areas of the porous particles 411 which define the gaps 411a and the pores 411b. As a result, the hole transport layer 41 can exhibit a superior solvent resistance as compared to a hole transport layer having a structure which does not have such porous particles 411. Therefore, when a light emitting layer (upper layer) 42 is to be formed on the hole transport layer (lower layer) so that these layers make contact with to each other in the subsequent light emitting layer formation step [3], it is possible to suppress or prevent appropriately the hole transport layer 41 from being swelled up or dissolved due to a solvent or a dispersion medium contained in a light emitting layer formation material for forming the light emitting layer 42.

Further, since the hole transport layer 41 has a structure in which the hole transport material 412 is carried by the porous particles 411 (that is, within the pores 411a as well as the gaps 411b), it is possible to reliably prevent the light emitting material which is a constituent material of the light emitting layer 42 and the hole transport material 412 from being mixed with each other with the elapse of time. As a result, it is possible to prevent reliably the luminescent efficiency of the light emitting layer 42 from being decreased with the elapse of time.

Due to the features mentioned above, the hole transport layer 41 can have an excellent hole transport ability, and an EL device provided with such a hole transport layer 41 can also exhibit excellent characteristics.

Although various materials can be used as the hole transport material (semiconductor material) 412 if they have a hole transport ability, conjugated compounds are preferably used. Such conjugated compounds can transport holes especially smoothly due to a characteristic derived from its unique spread of the electron cloud, and therefore such compounds can have an especially excellent hole transport ability.

Specifically, compounds represented by the following general formula (A1) or the following general formula (A2), compounds obtained by polymerization reaction of these compounds at their polymerizable groups, and other compounds such as follows can be preferably used for the hole transport material. Examples of such others compounds include: thiophene/styrenesulfonic acid-based compounds such as 3,4-ethylenedioxythiophene/styrenesulfonic acid; arylcycloalkane-based compounds such as 1,1-bis(4-di-para-triaminophenyl)cyclohexane and 1,1'-bis(4-di-para-tolylaminophenyl)-4-phenyl-cyclohexane; arylamine-based compounds such as 4,4',4"-trimethyltriphenylamine, N,N,N', N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine(TPD2), N,N,N',N'-tetrakis(4-methoxyphenyl)-1,1'-biphenyl-4,4'-diamine(TPD3), N,N'-di(1-naphthyl)-N,N'-diphenyl-1,1'-biphenyl-4,4'-diamine(α-NPD), and TPTE; phenylenediamine-based compounds such as N,N,N',N'-tetraphenyl-para-phenylenediamine, N,N,N',N'-tetra(para-tolyl)-para-phenylenediamine, and N,N,N',N'-tetra(meta-tolyl)-meta-phenylenediamine(PDA); carbazole-based compounds such as carbazole, N-isopropylcarbazole, and N-phenyl-carbazole; stilbene-based compounds such as stilbene, and 4-di-para-tolylaminostilbene; oxazole-based compounds such as $O_xZ$; triphenylmethane-based compounds such as triphenylmethane, and m-MTDATA; pyrazoline-based compounds such as 1-phenyl-3-(para-dimethylaminophenyl)pyrazoline; benzine(cyclohexadiene)-based compounds; triazole-based compounds such as triazole; imidazole-based compounds such as imidazole; oxadiazole-based compounds such as 1,3,4-oxadiazole, and 2,5-di(4-dimethylaminophenyl)-1,3,4-oxadiazole; anthracene-based compounds such as anthracene, and 9-(4-diethylaminostyryl)anthracene; fluorenone-based compounds such as fluorenone, 2,4,7-trinitro-9-fluorenone, and 2,7-bis(2-hydroxy-3-(2-chlorophenylcarbamoyl)-1-naphthylazo)fluorenone; aniline-based compounds such as polyaniline; silane-based compounds; thiophene-based compounds such as polythiophene, and poly(thiophenevinylene); pyrrole-based compounds such as poly(2,2'-thienylpyrrole), and 1,4-dithioketo-3,6-diphenyl-pyrrolo-(3,4-c)pyrrolopyrrole; florene-based compounds such as florene; porphyrin-based compounds such as porphyrin, and metal tetraphenylporphyrin; quinacridon-based compounds such as quinacridon; metallic or non-metallic phthalocyanine-based compounds such as phthalocyanine, copper phthalocyanine, tetra(t-butyl)copper phthalocyanine, and iron phthalocyanine; metallic or non-metallic naphthalocyanine-based compounds such as copper naphthalocyanine, vanadyl naphthalocyanine, and monochloro gallium naphthalocyanine; and benzidine-based compounds such as N,N'-di(naphthalene-1-yl)-N,N'-diphenyl-benzidine and N,N,N',N'-tetraphenylbenzidine. Polymers formed from these compounds have a higher hole transport ability.

Among these compounds, compounds having polymerizable groups can be preferably used as the hole transport material (semiconductor material) 412, in particular. This makes it possible to highly-polymerizing the hole transport material 412 by polymerizing the polymerizable groups of the compounds constituting the hole transport material 412. Such a polymer is easily entwined with the surfaces of the porous particles. As a result, the polymer is firmly or reliably carried by the surfaces of the porous particles 411, that is the pores 411a and the gaps 411b. Consequently, it is possible to exhibit the result obtained by forming the hole transport layer 41 to have such a structure as described above more conspicuously.

Specifically, as for examples of such a highly-polymerized hole transport material 412, a polymer obtained by polymerization reaction at the polymerizable groups of the compounds represented by the following general formula (A1) or (A2) can be mentioned. Since such a polymer can exhibit a higher hole transport ability, it can be effectively used as the hole transport material in particular.

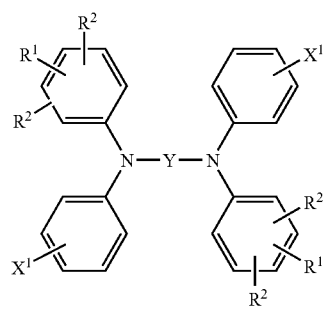

(A1)

wherein two $R^1$s are the same or different and each independently represents a straight-chain alkyl group having 2 to 8 carbon atoms, four $R^2$s are the same or different and each independently represents a hydrogen atom, a methyl group or an ethyl group, Y represents a group containing at least one substituted or unsubstituted aromatic hydrocarbon ring or substituted or unsubstituted heterocycle, and two $X^1$s are the same kind of substituent represented by any one of the following general formulas (B1) to (B3), in which the number of carbon atoms of the two $X^1$s are the same as or different from to each other; or

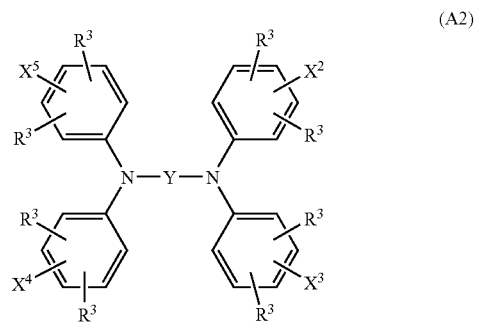

(A2)

wherein eight $R^3$s are the same or different and each independently represents a hydrogen atom, a methyl group, or an ethyl group, Y represents a group containing at least one substituted or unsubstituted aromatic hydrocarbon ring or substituted or unsubstituted heterocycle, and $X^2$, $X^3$, $X^4$ and $X^5$ are the same kind of substituent which is represented by any one of the following general formulas (B1) to (B3), in which the number of carbon atoms of $X^2$, $X^3$, $X^4$ and $X^5$ are the same as or different from each other.

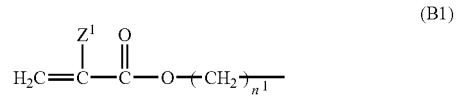

(B1)

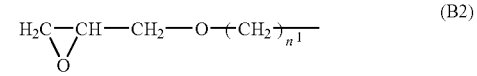

(B2)

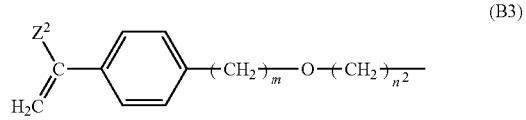

(B3)

wherein $n^1$ is an integer of 2 to 8, $n^2$ is an integer of 3 to 8, m is an integer of 0 to 3, $Z^1$ represents a hydrogen atom or a methyl group, and $Z^2$ represents a hydrogen atom, a methyl group or an ethyl group.

Details of these compounds will be described later.

Various materials can be used as a constituent material of the porous particles 411 if they do not decrease a carrier transport ability of the hole transport material (semiconductor material) 412 in the hole transport layer 41 and they are formed with pores 411a, but it is preferred that the porous particles 411 are mainly formed of an inorganic oxide. This makes it possible to obtain porous particles 411 having the above structure relatively easily.

Examples of such an inorganic oxide include inorganic oxides containing at least one of the elements (atoms) such as Si, Al, Zu, Sn, Li, Be, B, Na, Mg, K, Ca, Sc, V, Cr, Mn, Co, Ni, Ga, Rb, Sr, Y, Zr, Nb, Mo, Cd, Sb, Cs, Ba, La, Hf, Ta, W, Tl, Pb, Bi, Ce, Pr, Nd, Pm, Sm, Eu, Gd, Tb, Dy, Ho, Er, Tm, Yn, Lu, In, Ti, Cu, and Fe.

Among these substances, it is preferred that the inorganic oxides are constituted from at least one or more of $SiO_2$, $Al_2O_3$, ZnO, $SnO_2$, $CeO_2$, ITO, $TiO_2$, CuO, $Fe_2O_3$, CoO, and $Y_2O_3$, and more preferably constituted from on or more of $SiO_2$, $Al_2O_3$, ZnO, and $SnO_2$. By using these inorganic oxides, it is possible to obtain porous particles 411 having the above mentioned structure.

The porous particles 411 mentioned above may be formed of one kind of inorganic oxide mentioned above or two or more kinds of inorganic oxides mentioned above.

It is preferred that the porosity of the porous particles 411 is formed as large as possible within the extent that the mechanical strength thereof is not noticeably lowered. Specifically, the porosity of the porous particles 411 is preferably in the range of about 20 to 75%, and more preferably in the range of about 35 to 60%. This makes it possible to fill the pores 411a of the porous particles 411 with more amount of the hole transport material 412 while preventing the mechanical strength of the porous particles 411 from being lowered.

Although there is no limitation on the shape of each porous particle 411, it is preferred that each porous particle has a spherical shape or polyhedra shape. By selecting porous particles 411 having such a shape, it is possible to reduce the ratio occupied by the gaps 411b in the hole transport layer 41 while making it possible to increase the contact area between the porous particles 411. As a result, it is possible to increase the ratio of the hole transport material 412 filled in the pores 4121a further as compared to the ratio of the hole transport material 412 filled in the gaps 411b. Consequently, in the following light emitting layer formation step [3], it is possible to make an area where the hole transport material 412 is directly exposed to a light emitting layer formation material smaller, and therefore it is possible to suppress or prevent appropriately the hole transport layer 41 from being swelled up or dissolved due to a solvent or a dispersion medium contained in the light emitting layer formation material for forming the light emitting layer 42.

In the case where porous particles 411 having a spherical shape are used, an average particle size of the porous particles 411 is preferably in the range of about 2 to 200 nm, and more preferably in the range of about 30 to 100 nm. If the average particle size of the porous particles 411 is too small, there is a case that formation of the pores 411a becomes difficult and a sufficient strength of the porous particles 411 cannot be obtained. On the other hand, if the average particle size of the porous particles 411 is too large, an area occupied by the gaps 411b in the hole transport layer 41 becomes large. As a result, since an amount of the hole transport material 412 which is exposed to the surface of the hole transport layer 41 becomes large, there is a case that the hole transport material 412 is swelled up or dissolved due to a solvent or a dispersion medium contained in the light emitting layer formation material.

In this regard, it is to be noted that when porous particles 411 having a shape other than the spherical shape are used, it is preferred that an average value of a half of the sum of the maximum length and the minimum length of each porous particle 411 lies within the above range.

Further, it is preferred that each of the porous particles 411 has the same shape from the viewpoint of allowing the porous particles 411 to exist with a higher density or in close contact to each other, but porous particles having different kinds of shapes may be used.

Furthermore, it is also preferred that the hole transport material 412 has a volume resistance of $10\, \Omega \cdot cm$ or more, and preferably $10^2\, \Omega \cdot cm$ or more. This makes it possible to obtain an EL device having a high luminescent efficiency.

An average thickness of the hole transport layers 41 is not limited to any specific value, but it is preferably in the range of about 10 to 150 nm, and more preferably in the range of about 50 to 100 nm. If the thickness of the hole transport layer 41 is too thin, there is a possibility that pin holes are formed. On the other hand, if the thickness of the hole transport layer is too thick, it may result in a reduced transmittance of the hole transport layer 41, thus leading to the case where chromaticity (hue) of emitted light is adversely changed.

Here, when a current flows between the anode 3 and the cathode 5 (that is, a voltage is applied across the anode 3 and the cathode 5), holes emitted from the anode 3 are transported in the hole transport layer 41, and electrons are emitted from the cathode 5. Then, in the light emitting layer 42, excitons are produced by energy released upon the recombination, and the excitons release energy (in the form of fluorescence or phosphorescence) or emit light when returning to the ground state.

As a constituent material (light emitting material) of the light emitting layer 42, various materials can be used if, by using such materials, holes are injected into the light emitting layer 42 from the anode 3 and electrons are injected into the light emitting layer 42 from the cathode 5 when a voltage is applied across the anode 3 and the cathode 5 to thereby providing a filed in which the holes and the electrons can be recombined.

As such light emitting materials, there are various low molecular type light emitting materials and various high molecular type light emitting materials as mentioned hereinbelow, and at least one of these materials can be used.

In this regard, it is to be noted that when a low molecular type light emitting material is used, a dense light emitting layer can be obtained, thus enabling to increase a light emitting efficiency of the light emitting layer 42. On the other hand, when a high molecular type light emitting material is used, it is possible to form a light emitting layer 42 easily using any one of various application methods such as an ink-jet printing method and the like since such a material can be dissolved into a solvent relatively easily. Further, when the low molecular type light emitting material is used in combination with the high molecular type light emitting material, it is possible to obtain a synergistic effect of both the low molecular type light emitting material and the high molecular type light emitting material. That is to say, it is possible to obtain an effect that a dense light emitting layer 42 having a high luminescent efficiency can be easily formed by using various application methods such as an ink-jet printing method and the like.

Examples of such a low molecular type light emitting material include: benzene-based compounds such as distyrylbenzene (DSB), and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene and N,N'-bis(2,5-di-t-butylphenyl)-3,4,9,10-perylene-di-carboxylmide (BPPC); coronene-based compounds such as coronene; anthracene-based compounds such as anthracene and bisstyrylanthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzooxazolethiophene; benzooxazole-based compounds such as benzooxazole; benzoimidazole-based compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; spiro compounds such as 2,2',7,7'-tetraphenyl-9,9'-spirobifluorene; metallic or non-metallic phthalocyanine-based compounds such as phthalocyanine ($H_2Pc$) and copper phthalocyanine; florene-based compounds such as florene; and various metallic complexes such as 8-hydroxyquinoline aluminum ($Alq_3$), tris(4-methyl-8-quinolinolate) aluminum(III) ($Almq_3$), (8-hydroxyquinoline) zinc ($Znq_2$), (1,10-phenanthroline)-tris-(4,4,4-trifluoro-1-(2-thienyl)-butane-1,3-dionate) europium(III) ($Eu(TTA)_3$ (phen)), fac-tris(2-phenylpyridine) iridium ($Ir(ppy)_3$), and (2,3,7,8,12,13,17,18-octaethyl-21H, 23H-porphin) platinum (II).

Examples of such a high molecular type light emitting material include polyacetylene-based compounds such as trans-type polyacetylene, cis-type polyacetylene, poly(diphenylacetylene) (PDPA), and poly(alkyl, phenylacetylene) (PAPA); polyparaphenylenevinylene-based compounds such as poly(para-phenylenevinylene) (PPV), poly(2,5-dialkoxy-para-phenylenevinylene) (RO-PPV), cyano-substituted-poly(para-phenylenevinylene) (CN-PPV), poly(2-dimethyloctyl-silyl-para-phenylenevinylene) (DMOS-PPV), and poly(2-methoxy-5-(2'-ethylhexoxy)-para-phenylenevinylene) (MEH-PPV); polythiophene-based compounds such as poly(3-alkylthiophene) (PAT), and poly(oxypropylene)triol (POPT); polyfluorene-based compounds such as poly(9,9-dialkylfluorene) (PDAF), α,ω-bis[N,N'-di(methylphenyl) aminophenyl]-poly[9,9-bis(2-ethylhexyl)fluorene-2,7-diyl] (PF2/6am4), poly(9,9-dioctyl-2,7-divinylenefluorenyl)-alt-co(anthracene-9, 10-diyl); polyparaphenylene-based compounds such as poly(para-phenylene) (PPP), and poly(1,5-dialkoxy-para-phenylene) (RO-PPP); polycarbazole-based compounds such as poly(N-vinylcarbazole) (PVK); and polysilane-based compounds such as poly(methylphenylsilane) (PMPS), poly(naphthylphenylsilane) (PNPS), and poly(biphenylylphenylsilane) (PBPS).

Further, in addition to the light emitting materials mentioned above, it is also possible to use the compounds represented by the above-mentioned general formula (A1) and the above-mentioned general formula (A2) and polymers obtained by polymerization reaction of these compounds at their polymerizable groups, which have been described above with reference to the hole transport material, as the light emitting material depending on the kind of the hole transport material 412 used in the hole transport layer 41.

These compounds will be described later in details.

The average thickness of the light emitting layer 42 is not limited to any specific value, but is preferably in the range of about 10 to 150 nm, and more preferably in the range of about 50 to 100 nm. By setting the thickness of the light emitting layer to a value within the above range, recombination of holes and electrons efficiently occurs, thereby enabling the light emitting efficiency of the light emitting layer 42 to be further improved.

As described above, the protection layer 6 is provided so as to cover the layers 3, 4 and 5 constituting the EL device 1. This protection layer 6 has the function of hermetically sealing the layers 3, 4 and 5 constituting the EL device 1 to shut off oxygen and moisture. By providing such a protection layer 6, it is possible to obtain the effect of improving the reliability of the EL device 1 and the effect of preventing the alteration and deterioration of the EL device 1.

Examples of a constituent material of the protection layer 6 include Al, Au, Cr, Nb, Ta and Ti, alloys containing them, silicon oxide, various resin materials, and the like. In this regard, it is to be noted that in the case where a conductive material is used as a constituent material of the protection layer 6, it is preferred that an insulating film is provided between the protection layer 6 and each of the layers 3, 4 and 5 to prevent a short circuit therebetween, if necessary.

The EL device 1 can be used for a display, for example, but it can also be used for various optical purposes such as a light source and the like.

In the case where the organic EL device 1 is used for a display, the drive system thereof is not particularly limited, and either of an active matrix system or a passive matrix system may be employed.

The organic EL device 1 as described above can be manufactured in the following manner, for example.

[1] Step of Forming an Anode

First, a substrate 2 is prepared, and then an anode 3 is formed on the substrate 2.

The anode 3 can be formed by, for example, chemical vapor deposition (CVD) such as plasma CVD, thermal CVD, and laser CVD, vacuum deposition, sputtering, dry plating such as ion plating, wet plating such as electrolytic plating, immersion plating, and electroless plating, thermal spraying, a sol-gel method, a MOD method, bonding of a metallic foil, or the like.

[2] Step of Forming a Hole Transport Layer

Next, a hole transport layer 41 is formed on the anode 3. A semiconductor layer formation material according to the present invention is used for forming the hole transport layer 41.

[2-1]

First, a hole transport layer formation material (a semiconductor layer formation material according to the present invention) is prepared. The hole transport layer formation material contains a hole transport material (a semiconductor material) 412, porous particles 411, and a dispersion medium, wherein the hole transport material is existed in the hole transport layer formation material in such a state that at least a part of the hole transport material is filled in the pores of the porous particles.

Such a hole transport layer formation material can be obtained by the following method, for example. Namely, after dissolving or dispersing the hole transport material 412 into a dispersion medium, and then the porous particles 411 are added to the dispersion medium with imparting vibration thereto by agitation or the like.

In this case, it is preferred that the porous particles 411 and the hole transport material 412 in the hole transport layer formation material satisfies the following relation. When the amount of the porous particles 411 contained in the hole transport layer formation material is defined as A wt % and the amount of the hole transport material is defined as B wt %, the value A/B satisfies preferably the relation of 0.1 to 9, and more preferably the relation of 1 to 7. By satisfying such a relation, it is possible to fill the pores 411a and the gaps 411b with the hole transport material 412 and to carry the hole transport material 412 with the pores 411a and the gaps 411b reliably in the hole transport layer 41 to be formed.

Examples of such a dispersion medium include: inorganic solvents such as nitric acid, sulfuric acid, ammonia, hydrogen peroxide, water, carbon disulfide, carbon tetrachloride, and ethylene carbonate; and various organic solvents such as ketone-based solvents e.g., methyl ethyl ketone (MEK), acetone, diethyl ketone, methyl isobutyl ketone (MIBK), methyl isopropyl ketone (MIPK), and cyclohexanone, alcohol-based solvents e.g., methanol, ethanol, isopropanol, ethylene glycol, diethylene glycol (DEG), and glycerol, ether-based solvents e.g., diethyl ether, diisopropyl ether, 1,2-dimethoxy ethane (DME),1,4-dioxane, tetrahydrofuran (THF), tetrahydropyran (THP), anisole, diethylene glycol dimethyl ether (diglyme), and diethylene glycol ethyl ether (Carbitol), cellosolve-based solvents e.g., methyl cellosolve, ethyl cellosolve, and phenyl cellosolve, aliphatic hydrocarbon-based solvents e.g., hexane, pentane, heptane, and cyclohexane, aromatic hydrocarbon-based solvents e.g., toluene, xylene, and benzene, aromatic heterocyclic compound-based solvents e.g., pyridine, pyrazine, furan, pyrrole, thiophene, and methylpyrrolidone, amide-based solvents e.g., N,N-dimethylformamide (DMF) and N,N-dimethylacetamide (DMA), halogen compound-based solvents e.g., dichloromethane, chloroform, and 1,2-dichloroethane, ester-based solvents e.g., ethyl acetate, methyl acetate, and ethyl formate, sulfur compound-based solvents e.g., dimethyl sulfoxide (DMSO) and sulfolane, nitrile-based solvents e.g., acetonitrile, propionitrile, and acrylonitrile, organic acid-based solvents e.g., formic acid, acetic acid, trichloroacetic acid, and trifluoroacetic acid, and mixed solvents containing them.

Further, in the case where a hole transport material 412 comprised of a compound having polymerizable groups is used, it is preferred that a polymerization initiator is added to the hole transport layer formation material. This makes it possible to promote polymerization reaction at the polymerizable groups by subjecting the material to heat treatment or light irradiation treatment in the later process [2-4].

Examples of a polymerization initiator include, but are not limited thereto, photopolymerization initiators such as radical photopolymerization initiators and cationic photopolymerization initiators, heat polymerization initiators, and anaerobic polymerization initiators.

Examples of such cationic photopolymerization initiators include onium salt-based cationic photopolymerization initiators such as aromatic sulfouium salt-based cationic photopolymerization initiators, aromatic iodonium salt-based cationic photopolymerization initiators, aromatic diazonium cationic photopolymerization initiators, pyridium salt-based cationic photopolymerization initiators, and aromatic phosphonium salt-based cationic photopolymerization initiators; and nonionic cationic photopolymerization initiators-such as iron arene complex and sulfonate ester.

Further, examples of such radical photopolymerization initiators include benzophenone-based radical photopolymerization initiators, benzoin-based radical photopolymerization initiators, acetophenone-based radical photopolymerization initiators, benzylketal-based radical photopolymerization initiators, Michler's keton-based radical photopolymerization initiators, acylphosphine oxide-based radical photopolymerization initiators, ketocoumarin-based radical photopolymerization initiators, xanthene-based radical photopolymerization initiators, and thioxanthone-based radical photopolymerization initiators.

Further, in the case where a photopolymerization initiator is used as a polymerization initiator, a sensitizer suitable for the photopolymerization initiator to be used may be added to the composition for conductive materials.

[2-2]

Next, by supplying the hole transport layer formation material onto the anode 3, a liquid coating (coating layer) is formed.

In the supply of the hole transport layer formation material, various application methods such as a spin coating method, a casting method, a micro gravure coating method, a gravure coating method, a bar coating method, a roll coating method, a wire-bar coating method, a dip coating method, a spray coating method, a screen printing method, a flexographic printing method, an offset printing method, an ink-jet method, and the like can be employed. According to such an application method, it is possible to relatively easily supply the hole transport layer formation material onto the anode 3 to form the liquid coating.

[2-3]

Next, the dispersion medium is removed from the liquid coating (hole transport layer formation material) supplied onto the anode 3. By removing the dispersion medium, a hole transport layer 41 comprised of the porous particles 411 and the hole transport material (semiconductor material) 412 filled in the pores 411a of the porous particles 411 and the gaps 411b among the porous particles 411 is formed on the anode 3.

By allowing the hole transport layer 41 to have such a structure as described above, it is possible to suppress or prevent appropriately the hole transport layer 41 from being swelled up or dissolved due to a solvent or a dispersion medium contained in a light emitting layer formation material when the light emitting layer formation material in a liquid state is supplied in the following light emitting layer formation step [3]. As a result, it is possible to prevent a mutual dissolution from occurring between the hole transport material 41 and the light emitting layer 42.

Examples of the method for removing the dispersion medium include a method for heating, a method for drying in vacuum or under reduced pressure, and a method for blowing an inactivated gas, and the like. Among these methods, the heating method is preferably used. According to this heating method, it is possible to remove the dispersion medium relatively easily and reliably.

[2-4]

Next, when the hole transport material 412 is comprised of a compound having polymerizable groups, the hole transport material 412 is polymerized by polymerizing the polymerizable groups of the compounds of the hole transport material 412. This makes it possible to conspicuously exhibit the effect obtained by allowing the hole transport layer 41 to have such a structure described above.

Examples of the method for polymerizing the polymerizable groups include a method for irradiating light, a heating method, an anaerobic treatment method, and the like.

When a method for irradiating light is used, infrared ray, visible ray, ultraviolet ray, X-ray and the like can be used as the light for polymerization, and these rays may be used alone or in combination of two or more of them. Among these rays, an ultraviolet ray is particularly preferably used. This makes it possible to progress polymerization reaction between the polymerizable groups easily and reliably.

The hole transport layer 41 may be formed, for example, by the following method besides the method using the hole transport layer formation material described above.

[2'-1]

First, porous particles which are deposited in a coating state (hereinafter, referred to as "porous particles deposition coating") are provided on the anode 3.

Although there is no limitation on the method for forming such a porous particles deposition coating, it may be formed by the following method.

Namely, after supplying a dispersion liquid containing porous particles and a dispersion medium onto the anode 3, the dispersion medium is removed, thereby enabling to obtain the porous particles deposition coating (that is, the coating state deposition of the porous particles). According to this method, it is possible to form such a porous particles deposition coating on the anode 3 relatively easily and reliably.

As for the dispersion medium, the method for supplying the dispersion medium, and the method for removing the dispersion medium, those described above with reference to the prior step [2] can be used.

[2'-2]

Next, a liquid material containing the hole transport material (semiconductor material) 412 and a solvent or a dispersion medium is supplied so that the liquid material is penetrated into the porous particles deposition coating of the porous particles 411. As a result, the pores 411a of the porous particles 411 and the gaps 411b among the porous particles 411 are filed with the liquid material.

As for the dispersion medium and the method for supplying the dispersion medium, those described above with reference to the prior step [2] can be used.

[2'-3]

Next, the solvent or dispersion medium is removed from the liquid material filled in the pores 411a and the gaps 411b. Consequently, in the same manner as the prior step [2], it is possible to form a hole transport layer comprised of the porous particles 411 and the hole transport material (semiconductor material) 412 filed in the pores 411a of the porous particles 411 and the gaps among the porous particles 411 on the anode 3.

As for the method for removing the solvent or dispersion medium, those described above with reference to the prior step [2] can be used.

[2'-4]

Next, when the hole transport material 412 is formed of a compound having polymerizable groups, the hole transport material 412 is polymerized using the same method as described above with reference to the step [2-4], that is, the polymerizable groups of the compounds of the hole transport material 412 are polymerized.

[3] Step of Forming a Light Emitting Layer

Next, a light emitting layer 42 is formed on the hole transport layer 41.

The light emitting layer 42 can be formed by, for example, applying onto the hole transport layer 41, a light emitting layer material (that is, a material for forming a light emitting layer) obtained by dissolving the light emitting material as described above in a solvent or dispersing the light emitting material in a dispersion medium.

As a solvent or dispersion medium in which the light emitting material is to be dissolved or dispersed, the same solvent or dispersion medium that is used in forming the hole transport layer 41 can be used.

Further, as a method for applying the light emitting layer material onto the hole transport layer 41, the same application method that is used in forming the hole transport layer 41 can be employed.

[4] Step of Forming an Electron Transport Layer

Next, an electron transport layer 43 is formed on the light emitting layer 42.

The electron transporting layer 43 can be formed in the same manner as the light emitting layer 42. Namely, the electron transport layer 43 can be formed using the electron transport material as described above by the method described with reference to the light emitting layer 42.

[5] Step of Forming Cathode

Next, a cathode 5 is formed on the electron transport layer 43.

The cathode 5 can be formed by, for example, vacuum deposition, sputtering, bonding of a metallic foil, or the like.

[6] Step of Forming Protection Layer

Next, a protection layer 6 is formed so as to cover the anode 3, the EL layer 4, and the cathode 5.

The protection layer 6 can be formed or provided by, for example, bonding a box-like protection cover made of the material as mentioned above by the use of various curable resins (adhesives).

As for such curable resins, all of thermosetting resins, photocurable resins, reactive curable resins, and anaerobic curable resins can be used.

The EL device 1 is manufactured through these steps as described above.

Second Embodiment

Hereinbelow, a description will be made with regard to the second embodiment of the EL device of the present invention.

Figure 3:
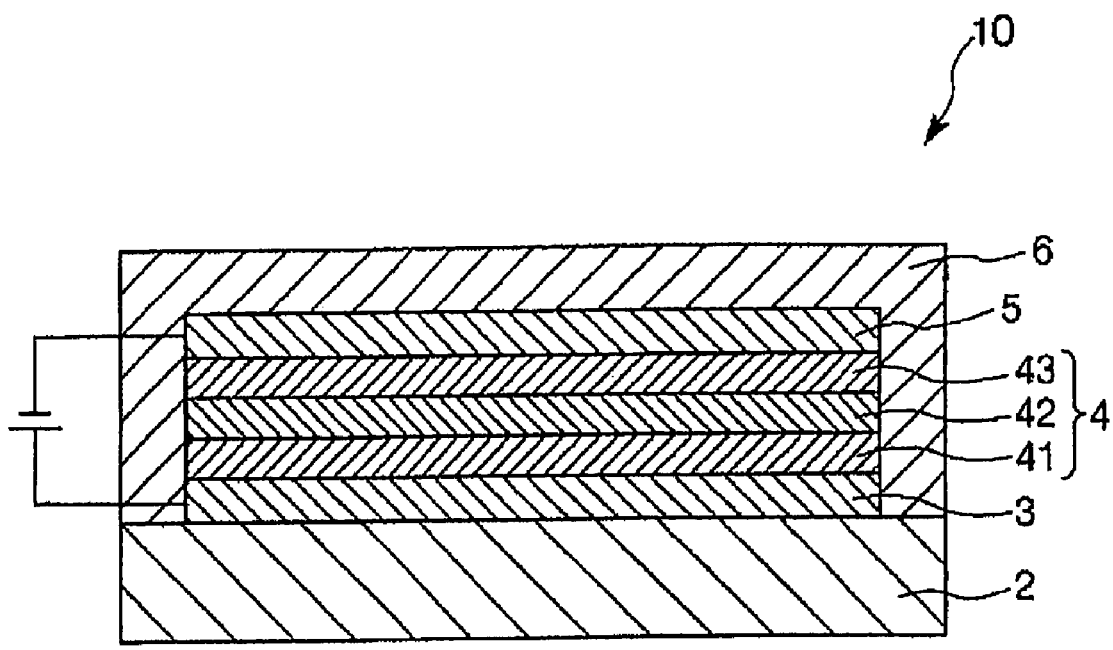
FIG. 3 is a cross-sectional view which shows a second embodiment of a semiconductor element according to the present invention, which is directed to a case where the semiconductor element is applied to other EL device.

FIG. 3 is a cross-sectional view which shows a second embodiment of an EL device. In the following description, the upper side in FIG. 3 will be referred to as "upper" or "upper sides" and the lower side thereof will be referred to as "lower" or "lower side".

In the following description, an explanation will be made by focusing on different points from the first embodiment and an explanation on the common points is omitted.

The EL device of the second embodiment has the same structure as that of the EL device of the first embodiment excepting that an electron transport layer 43 is formed between the light emitting layer 42 and the cathode 5.

Hereinbelow, an explanation will be made with regard to these points.

The electron transport layer 43 is a layer having the function of transporting electrons injected from the cathode 5 into the light emitting layer 42. By providing such an electron transport layer 43 between the cathode 5 and the light emitting layer 42, it is possible to relatively easily control so that holes and electrons respectively injected from the anode 3 and the cathode 5 are recombined in the light emitting layer 42.

Examples of a material that can be used for the electron transport layer 43 include: benzene-based compounds (starburst-based compounds) such as 1,3,5-tris[(3-phenyl-6-trifluoromethyl)quinoxaline-2-yl]benzene (TPQ1), and 1,3,5-tris[{3-(4-t-butylphenyl)-6-trisfluoromethyl}quinoxaline 2-yl]benzene (TPQ2); naphthalene-based compounds such as naphthalene; phenanthrene-based compounds such as phenanthrene; chrysene-based compounds such as chrysene; perylene-based compounds such as perylene; anthracene-based compounds such as anthracene; pyrene-based compounds such as pyrene; acridine-based compounds such as acridine; stilbene-based compounds such as stilbene; thiophene-based compounds such as BBOT; butadiene-based compounds such as butadiene; coumarin-based compounds such as coumarin; quinoline-based compounds such as quinoline; bistyryl-based compounds such as bistyryl; pyrazine-based compounds such as pyrazine and distyrylpyrazine; quinoxaline-based compounds such as quinoxaline; benzoquinone-based compounds such as benzoquinone, and 2,5-diphenyl-para-benzoquinone; naphthoquinone-based compounds such as naphthoquinone; anthraquinone-based compounds such as anthraquinone; oxadiazole-based compounds such as oxadiazole, 2-(4-biphenylyl)-5-(4-t-butylphenyl)-1,3,4-oxadiazole (PBD), BMD, BND, BDD, and BAPD; triazole-based compounds such as triazole, and 3,4,5-triphenyl-1,2,4-triazole; oxazole-based compounds; anthrone-based compounds such as anthrone; fluorenone-based compounds such as fluorenone, and 1,3,8-trinitro-fluorenone (TNF); diphenoquinone-based compounds such as diphenoquinone, and MBDQ; stilbenequinone-based compounds such as stilbenequinone, and MBSQ; anthraquinodimethane-based compounds; thiopyran dioxide-based compounds; fluorenylidenemethane-based compounds; diphenyldicyanoethylene-based compounds; florene-based compounds such as florene; metallic or non-metallic phthalodyanine-based compounds such as phthalocyanine, copper phthalocyanine, and iron phthalocyanine; and various metal complexes such as 8-hydroxyquinoline aluminum ($Alq_3$), and complexes having benzooxazole or benzothiazole as a ligand. These compounds may be used singly or in combination of two or more of them.

In this regard, it is to be noted that compounds represented by the above-mentioned general formula (A1) and (A2) and polymers obtained by polymerization reaction of the compounds at their polymerizable groups, which have been explained with reference to the hole transport material described above, may be used as the electron transport material in addition to the electron transport materials mentioned above. Details of these compounds will be described later.

An average thickness of the electron transport layers 43 is not limited to a specific value, but it is preferably in the range of about 1 to 100 nm, and more preferably in the range of about 20 to 50 nm. If the thickness of the electron transport layer 43 is too thin, there is a possibility that pin holes are to be formed and thereby short circuit occurs. On the other hand, if the thickness of the electron transport layer is too thick, there is a case that resistance value becomes high.

In this embodiment, the light emitting layer 42 has a structure which is the same as the hole transport layer 41 of the first embodiment. Namely, the light emitting layer 42 is comprised of porous particles 411 and a light emitting material (semiconductor material) filled in pores 411a of the porous particles 411 and gaps among the porous particles 411. As a result, the same effect as that can be obtained in the first embodiment where the hole transport layer 41 is formed to have such a structure can be obtained in the same manner. That is, when the electron transport layer 43 is formed on the light emitting layer 42, it is possible to prevent reliably mutual dissolution at the boundary of the light emitting layer 42 and the electron transport layer 43 from occurring when the electron transport layer 43 is formed on the light emitting layer 42. Consequently, the light emitting layer 42 and the electron transport layer 43 can have excellent light emitting efficiency and excellent electron transport efficiency, respectively, and therefore an EL device provided with these layers can exhibit excellent characteristics.

Although the second embodiment has been described based on the case where each of the hole transport layer 41 and the light emitting layer 42 is comprised of porous particles 411 and the semiconductor material (that is, the hole transport material 41 and the light emitting material), the present invention is not limited to such a structure.

Specifically, one of the following modified structures (1) to (3) may be adopted. (1) one of the hole transport layer 41 and the light emitting layer 42 is formed from the porous particles 411 and the semiconductor material, (2) each of the hole transport layer 41, the light emitting layer 42, and the electron transport layer 43 is formed from the porous particles 411 and the semiconductor material, and (3) at least one of the hole transport layer 41 and the light emitting layer 42 has a structure in which an upper part of the layer which is close to a boundary between the layer and the adjacent upper layer is formed from the porous particles 411 and the semiconductor material and the other region of the layer is formed of only the semiconductor material.

Further, an additional layer may be provided between the respective layers for any arbitral purpose. For example, a hole injection layer may be provided between the hole transport layer 41 and the anode 3, and an electron injection layer may be provided between the electron transport layer 43 and the cathode 5. In the case where such a hole injection layer is provided in the EL device 1, 10, the hole injection layer may be formed of the hole transport material described above. Further, in the case where such an electron injection layer is provided in the EL device 10, the electron injection layer may be formed of alkali halide such as LiF and the like instead of the electron transport material described above.

Furthermore, although in the first and second embodiments the light emitting layer 42 is separately provided from the hole transport layer 41, they may be formed into a hole transport type light emitting layer having both the functions of the hole transport layer 41 and the light emitting layer 42.

<Compound Represented by General Formula (A1) or (A2)>

Hereinbelow, a description will be made with regard to the compound represented by the following general formula (A1) (hereinafter, simply referred to as "compound (A1)") and the compound represented by the following general formula (A2) (hereinafter, simply referred to as "compound (A2)") which have been referred in the descriptions with reference to the hole transport material 412, the light emitting material and the electron transport material.

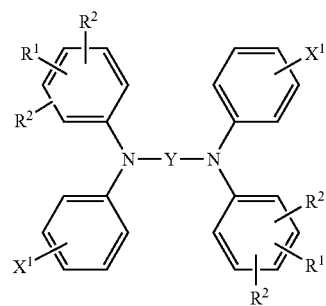

(A1)

wherein two $R^1$s are the same or different and each independently represents a straight-chain alkyl group having 2 to 8 carbon atoms, and four $R^2$s are the same or different and each independently represents a hydrogen atom, a methyl group or an ethyl group, Y represents a group containing at least one substituted or unsubstituted aromatic hydrocarbon ring or substituted or unsubstituted heterocycle, and two $X^1$s are the same kind of substituent represented by any one of the following general formulas (B1) to (B3), in which the number of carbon atoms of the two $X^1$s are the same as or different from to each other; or

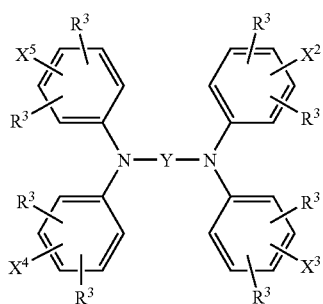

(A2)

wherein eight $R^3$s are the same or different and each independently represents a hydrogen atom, a methyl group, or an ethyl group, Y represents a group containing at least one substituted or unsubstituted aromatic hydrocarbon ring or substituted or unsubstituted heterocycle, and $X^2$, $X^3$, $X^4$ and $X^5$ are the same kind of substituent which is represented by any one of the following general formulas (B1) to (B3), in which the number of carbon atoms of $X^2$, $X^3$, $X^4$ and $X^5$ are the same as or different from each other.

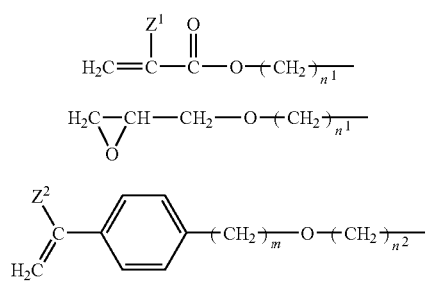

wherein $n^1$ is an integer of 2 to 8, $n^2$ is an integer of 3 to 8, m is an integer of 0 to 3, $Z^1$ represents a hydrogen atom or a methyl group, and $Z^2$ represents a hydrogen atom, a methyl group or an ethyl group.

Although each of these compounds (A1) and (A2) can exhibit an excellent carrier transport ability even in the state that the compound is not polymerized at its polymerizable groups, a polymer obtained by polymerizing each compound at its polymerizable groups can exhibit a more excellent carrier transport ability.

In this regard, it is to be noted that the term "polymerizable group" represents a substituent $X^1$ in the compound (A1), and each of the substituent $X^2$, and the substituent $X^3$ the substituent $X^4$ and the substituent $X^5$ in the compound (A2) (hereinbelow, they will be collectively referred to as the substituents $X^2$ to $X^5$ on occasions).

Hereinbelow, a description will be made with regard to the features of the polymers.

Each of the polymers is obtained by polymerization reaction of the compound (A1) or the compound (A2) (which is a diphenylamine derivative) through its polymerizable groups, that is, a polymer in which adjacent main skeletons (a diphenylamine skeleton) are linked via a chemical structure formed by the reaction between the polymerizable groups thereof (hereinafter, this chemical structure is collectively called as "first link structure").

First, a description will be made with regard to a polymer obtained from the compound (A1).

In a polymer obtained by a polymerization reaction of the compounds (A1) at their substituents $X^1$ (that is, a substituent $X^1$ of a compound (A1) and a substituent $X^1$ of a compound (A1)), the polymer has a structure in which the main skeletons of the compounds are repeatedly linked via the link structure, that is, a structure in which the main skeletons repeatedly exist at a predetermined interval. Therefore, the interaction between the adjacent main skeletons decreases.

Further, each main skeleton has a conjugated chemical structure, and a unique spread of the electron cloud thereof contributes to smooth transportation of carriers (holes or electrons) in the polymer.

For this reason, the polymer exhibits a high carrier transport ability. Therefore, a layer obtained by using such a polymer as its main material also has a high carrier transport ability.

In this regard, it is to be noted that if the interval between the main skeletons in the polymer is too small, interaction between the adjacent main skeletons tends to be strong. On the other hand, if the interval between the main skeletons in the polymer is too large, it becomes difficult to transfer carriers between the main skeletons, causing the carrier transport ability of the polymer to be impaired.

Therefore, it is preferred that the structure of the substituent $X^1$ is determined in view of these facts. Specifically, in the case where a substituent represented by the above general formula (B1) or (B2) is selected as the substituent $X^1$, it is preferred that the substituent $X^1$ has a straight-chain carbon to carbon link in which $n^1$ is 2 to 8, in particular 3 to 6. Further, in the case where a substituent represented by the above general formula (B3) is selected as the substituent $X^1$, it is preferred that the substituent $X^1$ has a straight-chain carbon to carbon link in which $n^2$ is 3 to 8 and m is 0 to 3, in particular $n^2$ is 4 to 6 and m is 1 or 2.

By satisfying the above relation, it becomes possible for the adjacent main skeletons to exist at a suitable interval, thereby decreasing the interaction between the adjacent main skeletons in the polymer reliably. In addition, it is also possible to transfer carriers between the main skeletons more reliably so that the polymer can also have a high carrier transport ability.

In this connection, in the case where a substituent represented by the above general formula (B1) or (B2) is selected as the substituent $X^1$, each substituent $X^1$ has a (meth)acryloyl group or an epoxy group as its end. Since each of the (meth)acryloyl group and the epoxy group has high reactivity and bonding stability, it is relatively easy to polymerize substituents $X^1$ directly to thereby form a polymer having a long chain length.

Further, the link structure obtained by polymerization reaction through the (meth)acryloyl groups has two double bonds (π bonds) each existing between an oxygen atom and a carbon atom. Therefore, even in the case where the interval between the main skeletons becomes relatively long, transfer of carriers between the main skeletons can be carried out reliably through the two π bonds (that is, conjugated bonds).

Furthermore, since a straight-chain carbon to carbon link (i.e., an alkylene group) exists between each of the two π bonds and each main skeleton, it is possible to prevent or suppress the interaction between the main skeletons from being enhanced.

Moreover, the link structure obtained by polymerization reaction of the epoxy groups has ether links (bonds) and a straight-chain carbon to carbon link (i.e., alkylene groups) exist. In such a link structure having the above structure, transfer of electrons is suppressed. Therefore, even in the case where the interval between the adjacent main skeletons is relatively small, it is possible to prevent or suppress the interaction between the main skeletons from being enhanced.

In this connection, it is to be noted that if the link structure has a structure having many conjugated π bonds such as a benzene ring, interaction occurs between the adjacent main skeletons through such a structure, which cancels the effect obtained by allowing the adjacent main skeletons to exist at a suitable interval.

In this regard, however, in the case where a substituent represented by the general formula (B3) is selected as the substituent $X^1$, the substituent $X^1$ has a styrene derivative group formed by introducing a substituent $Z^2$ to a styrene group as its functional group at one end thereof. Therefore, benzene rings exist in the link structure.

As a result, in the case where each of the benzene rings and each of the main skeletons having a conjugated chemical structure are too close to each other, that is, in the case where the benzene ring is linked to the main skeleton via an ether bond or in the case where the total of $n^2$ and m is two, interaction occurs between the adjacent main skeletons through the benzene rings.

However, in this polymer, the linkage between the main skeleton and the benzene ring is formed by $n^2$ and m the total of which is three or more, that is, three or more methylene groups and an ether bond exist therebetween. This makes it possible to maintain the interval between the main skeleton and the benzene ring at a suitable condition. With this result, it is possible to prevent or suppress interaction from occurring between the adjacent main skeletons appropriately.

Further, the substituent $Z^2$ is a hydrogen atom, a methyl group or an ethyl group, wherein the substituent $Z^2$ is selected in accordance with the total of $n^2$ and m, that is the total number of methylene groups.

For example, in the case where the total number is small, a methyl group or an ethyl group is selected as the substituent $Z^2$. Since a methyl group and an ethyl group are an electron-releasing substituent, it is possible to bias electrons to the side of the main skeleton by selecting a methyl group or an ethyl group as the substituent $Z^2$. With this result, it is possible to prevent appropriately interaction from occurring between the adjacent main skeletons which are existed through the benzene rings.

Because of the reasons stated in the above, it is preferred that the two substituents $X^1$ have substantially the same number of carbon atoms, and more preferably exactly the same number of carbon atoms. In such a case, the interval between the adjacent main skeletons can be made substantially constant. Therefore, it is possible to prevent uneven distribution of the electron density from occurring in the polymer, thereby enabling a carrier transport ability of the polymer to be improved.

Furthermore, it is to be noted that the substituent $X^1$ may be bonded to the 2-, 3-, 4-, 5- or 6-position of the benzene ring, but preferably bonded to the 3-, 4- or 5-position. This makes it possible to conspicuously exhibit the effect obtained by linking the adjacent main skeletons via the substituents $X^1$. Namely, it is possible for the adjacent main skeletons to exist at a suitable interval more reliably.

The substituent $R^1$ has a straight-chain alkyl group having 2 to 8 carbon atoms, preferably 3 to 6 carbon atoms. This makes it possible for adjacent polymers to exist at a suitable interval since the adjacent polymers are prevented from closely approaching to each other by steric hindrance of the substituents $R^1$. As a result, it becomes possible to reliably decrease the interaction between the adjacent main skeletons of different polymers in a layer to be formed, thereby enabling the layer to have a high carrier transport ability.

Preferably, the two substituents $R^1$ contain substantially the same number of carbon atoms, more preferably the same number of carbon atoms. This makes it possible for the adjacent polymers to exist at an interval of a certain distance in the layer. As a result, the density of polymers in the layer becomes uniform.

Further, the substituent $R^1$ may be bonded to any of the 2 to 6-position of a benzene ring, but preferably it is bonded to the 4-position. This makes it possible to exhibit the effect of introduction of the substituents $R^1$ more conspicuously. Namely, it is possible to reliably prevent the adjacent polymers from closely approaching to each other.

Furthermore, as described above, the substituent $R^2$ is a hydrogen atom, a methyl group, or an ethyl group, and the substituent $R^2$ is selected in accordance with the number of carbon in the substituent $R^1$. Specifically, when the number of carbon in the substituent $R^1$ is large, a hydrogen atom is selected as the substituent $R^2$, while when the number of carbon in the substituent $R^1$ is small, a methyl group or an ethyl group is selected as the substituent $R^2$.

In the compound (A1), it is possible to change the carrier transport properties of the polymer to be formed by appropriately setting the chemical structure of a group (or a linking group) Y.

This is considered to result from the phenomenon that the energy level of the valence and conduction bands or the size of the band gap in the polymer is changed according to changes in the spread of the electron cloud (i.e., distribution of electrons) in the main skeleton which contributes to carrier transportation.

In the compound (A1), the group Y contains at least one substituted or unsubstituted aromatic hydrocarbon ring or at least one substituted or unsubstituted heterocyclic ring. By selecting the kinds of the aromatic hydrocarbon ring and/or heterocyclic ring appropriately, it is possible to adjust carrier transport properties in a resultant polymer relatively easily.

For example, by selecting a structure constituted from an unsubstituted aromatic hydrocarbon ring as the group Y, it is possible to obtain a polymer which can exhibit a hole transport ability, and therefore the obtained polymer can be used as the hole transport material 412.

In more details, as for the structure constituted from the unsubstituted aromatic hydrocarbon ring, those represented by the following chemical formulas (C1) to (C17) can be mentioned.

(C1) to (C17)

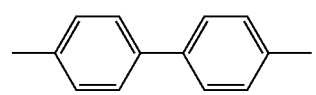

(C1)

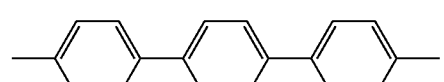

(C2)

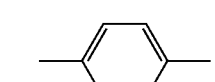

(C3)

(C4) 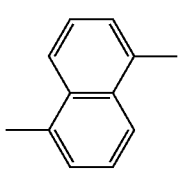

(C5) 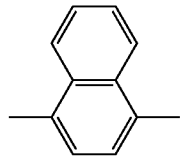

(C6) 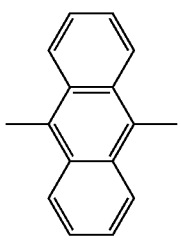

(C7) 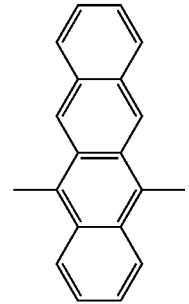

(C8) 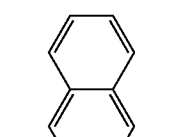

(C9) 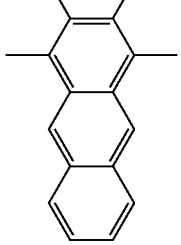

(C10) 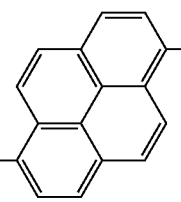

(C11) 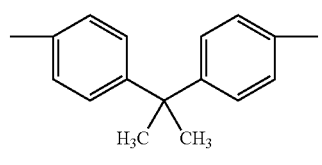

(C12) 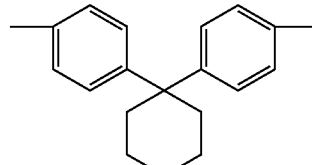

(C13) 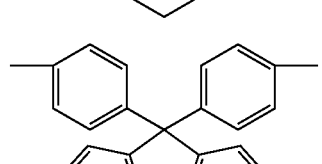

(C14) 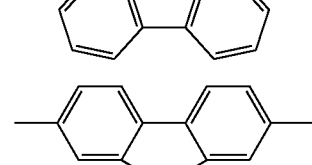

(C15) 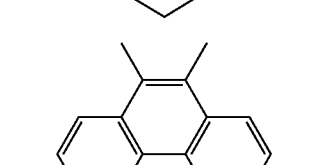

(C16) 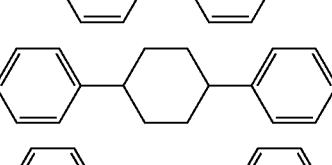

(C17) 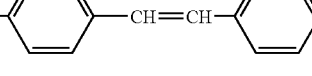

In this case, it is preferred that the group Y has 6 to 30 carbon atoms, more preferably 10 to 25 carbon atoms, and even more preferably 10 to 20, in total.

Further, in the group Y, it is preferred that the number of aromatic hydrocarbon ring is 1 to 5, more preferably 2 to 5, and even more preferably 2 or 3.

Taking the above-mentioned factors into account, in the compound (A1) a biphenylene group represented by the chemical formula (C1) or its derivative is considered to be an especially preferable structure as the group Y.

By selecting such a group, the hole transport ability in the resultant polymer becomes excellent, and thus a conductive layer to be formed from the polymer can also have a higher hole transport ability.

Next, by selecting a structure which contains at least one substituted or unsubstituted heterocyclic ring as the group Y, it is possible to control the carrier transport property of the resultant polymer relatively easily.

As for such a heterocyclic ring, it is preferred to select a heterocyclic ring which contains at least one heteroatom selected from among nitrogen, oxygen, sulfur, selenium, and tellurium. By selecting such a heterocyclic ring that contains such a kind of heteroatom, it is particularly easy to change the energy level of the valence and conduction bands or the size of the band gap of the polymer.

The heterocyclic ring may be either an aromatic heterocycle or a nonaromatic heterocycle, but an aromatic heterocycle is preferably used. By using an aromatic heterocycle, it is possible to properly prevent the electron density of the main skeleton with a conjugated chemical structure from being biased, that is, it is possible to properly prevent the localization of π electrons. As a result, the carrier transport ability of the polymer is prevented from being lowered.

The group Y preferably contains 1 to 5 heterocyclic rings, more preferably 1 to 3 heterocyclic rings. In the case where the group Y contains 2 or more heterocyclic rings, these rings are the same or different. By allowing the group Y to have such a number of heterocyclic rings, it is possible to sufficiently change the energy level of the valence and conduction bands or the size of the band gap of the polymer.

The group Y preferably has 2 to 75 carbon atoms, more preferably 2 to 50 carbon atoms, in total. If the group Y has too many carbon atoms in total, the solubility of the compound represented by the general formula (A1) in a solvent tends to be lowered depending on the kind of substituent $X^1$.

By setting a total number of carbon atoms contained in the group Y to a value within the above range, it is possible to maintain the planarity of the main skeleton. As a result, the carrier transport ability of the polymer is reliably prevented from being impaired.

Taking these factors into account, as a structure constituted from unsubstituted heterocyclic rings, such structures as represented by any one of the following chemical formulas (D1) to (D17) are considered to be preferable structures.

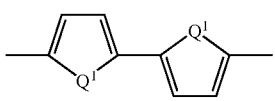

(D1)

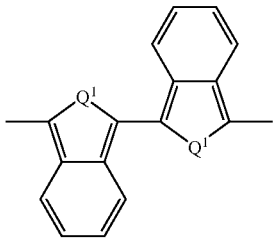

(D2)

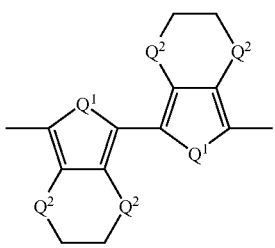

(D3)

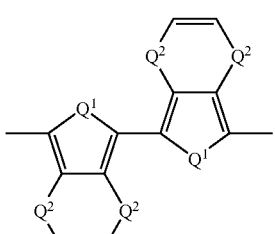

(D4)

-continued

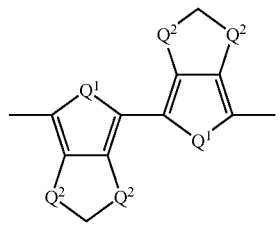

(D5)

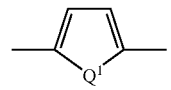

(D6)

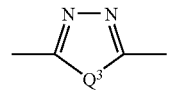

(D7)

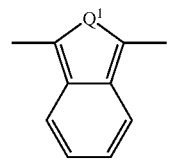

(D8)

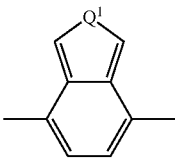

(D9)

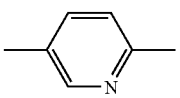

(D10)

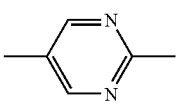

(D11)

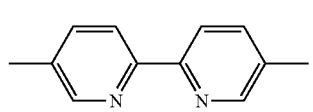

(D12)

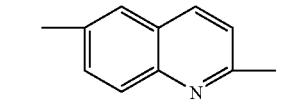

(D13)

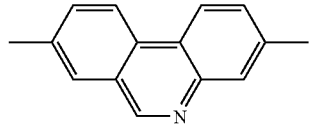

(D14)

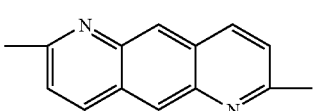

(D15)

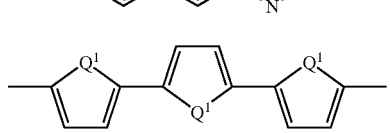

(D16)

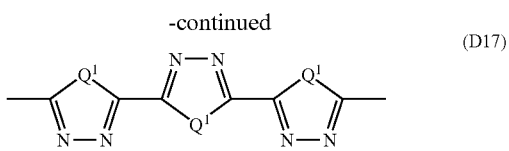
(D17)

wherein in these chemical formulas $Q^1$s are the same or different and each independently represents N-$T^1$, S, O, Se, or Te (where $T^1$ represents H, $CH_3$, or Ph), $Q^2$s are the same or different and each independently represents S or O, and $Q^3$s are the same or different and each independently represents N-$T^3$, S, O, Se, or Te (where $T^3$ represents H, $CH_3$, $C_2H_5$ or Ph).

Furthermore, by selecting chemical structures constituted from substituted or unsubstituted aromatic hydrocarbon ring and substituted or unsubstituted heterocyclic ring as the group (bonding group) Y, the synergistic effect resulted from the respective effects described above can be obtained.

In this regard, it is particularly preferred that such a group Y contains aromatic hydrocarbon rings respectively bonded to each of Ns in the compound (A1) and a heterocyclic ring existed between the aromatic hydrocarbon rings. This makes it possible to reliably prevent electron density from being biased in a resultant polymer. As a result, a carrier transport ability of the polymer can be made constant.

Taking these factors into account, as a structure constituted from the unsubstituted aromatic hydrocarbon rings and the heterocyclic ring, such structures as represented by any one of the following chemical formulas (E1) to (E3) are considered to be preferable structures.

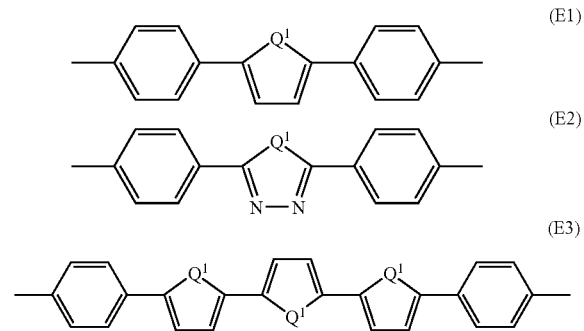

wherein in these chemical formulas $Q^1$s are the same or different and each independently represents N-$T^1$, S, O, Se, or Te (where $T^1$ represents H, $CH_3$, or Ph).

By appropriately determining the chemical structure of the group Y as described above, a polymer obtained by selecting any one of the chemical formulas (D2), (D16), (E1) and (E3) as the group Y can exhibit a high hole transport ability as compared to a polymer obtained by selecting the chemical formula (D17) and can exhibit an especially high hole transport ability as compared to a polymer obtained by selecting the chemical formula (D8) or (E2).

On the contrary, a polymer obtained by selecting any one of the chemical formulas (D8), (D17) and (E2) as the group Y can exhibit a high electron transport ability as compared to a polymer obtained by the chemical formula (D2) or (D16). Further, a polymer obtained by selecting any one of the chemical formulas (D8), (D17) and (E2) as the group Y can also exhibit an especially high electron transport ability as compared to a polymer obtained by selecting the chemical formula (E1) or (E3).

For the reasons stated in the above, in the case where a polymer obtained by selecting the structure represented by the chemical formula (D2), (D16), (E1) or (E3) as the group Y is used for the hole transport material 412, a polymer obtained by selecting the chemical formula (E2), (D8) and (D17) as the group Y can be used for the electron transport layer.

In this regard, it is to be noted that depending on the combination of the hole transport material 412 and the electron transport material, the polymer mentioned above can be used as the light emitting material.

For example, in the case where poly(thiophene/styrenesulfonic acid) such as poly(3,4-ethylenedioxythiophene/styrenesulfonic acid) or an arylamine compound such as N,N'-bis(1-naphthyl)-N,N'-diphenyl-benzidine(α-NPD) is used as a constituent material of the hole transport layer 412 and a triazole-based compound such as 3,4,5-triphenyl-1,2,4-triazole or an oxadiazole compound such as 2-(4-t-butylphenyl)-5-(biphenyl-4-yl)-1,3,5-oxadiazole (PBD) is used as a constituent material of the electron transport layer, a polymer of the compound represented by the general formula (A1) in which the group Y has a chemical structure represented by the chemical formula (D12) or (D14) can be used as a constituent material for forming a light emitting layer.

Further, the unsubstituted heterocyclic ring and/or the unsubstituted aromatic hydrocarbon ring contained in the group Y may introduce a substituent so long as the planarity of the main skeleton is not greatly affected. Examples of such a substituent include an alkyl group having a relatively small number of carbon atoms such as a methyl group or an ethyl group or and a halogen group and the like.

Hereinbelow, a description will be made with regard to a polymer obtained from the compound (A2).

In this regard, it should be noted that the following description will be made by focusing the different points from the polymer obtained from the compound (A1), and explanations for the same or similar points are omitted.

The compound (A2) is the same as the compound (A1) excepting that the compound (A1) has two substituents $X^1$ and two substituents $R^1$ while the compound (A2) has four substituents $X^2$ to $X^5$ and eight substituents $R^3$.

As for each of the substituents $X^2$ to $X^5$, a group having the same structure as that of the substituent $X^1$ is selected. In the compound (A2), since there are four substituents $X^2$ to $X^5$, a two-dimensional network is easily to be formed.

In the compound (A2), it is preferred that the substituent $X^2$ and the substituent $X^4$ are identical with each other. Namely, it is preferred that the substituent $X^2$ and the substituent $X^4$ have substantially the same number of carbon atoms and more preferably exactly the same number of carbon atoms. This makes it possible for the adjacent main skeletons of the compounds which are to be linked by the polymerization reaction between the respective substituents $X^2$ to $X^5$ (that is, the substituent $X^2$ or the substituent $X^4$) to make variation in their intervals small. Namely, it is possible to make variation in the intervals between the main skeletons small in a resultant polymer. As a result, it is possible to prevent the electron density from being biased in the resultant polymer effectively, thereby enabling a hole transport ability of the polymer to be improved.

In view of the above, it is also preferred that the substituent $X^3$ and the substituent $X^5$ are identical with each other. Namely, it is also preferred that the substituent $X^3$ and the substituent $X^5$ have substantially the same number of carbon atoms and more preferably exactly the same number of carbon atoms. This makes it possible to improve the above-described effect further, thereby enabling the carrier transport ability of the polymer to be further improved.

Further, it is also preferred that the substituent $X^2$, the substituent $X^3$, the substituent $X^4$ and the substituent $X^5$ are identical with each other. Namely, it is also preferred that the substituent $X^2$, the substituent $X^3$, the substituent $X^4$ and the substituent $X^5$ have substantially the same number of carbon atoms and more preferably exactly the same number of carbon atoms. This makes it possible to exhibit the above-described effect conspicuously. Further, in this case, since the length of each of the substituents $X^2$ to $X^5$ which protrudes from the main skeleton is substantially the same (or exactly the same) with each other, it is possible to decrease a possibility that steric hindrance is caused by the substituents $X^2$ to $X^5$. This makes it possible that polymerization reaction is carried out reliably between the substituents $X^2$ to $X^5$, that is the polymer is produced reliably. With this result, it is possible to further improve the carrier transport ability of the polymer.

The substituent $R^3$ is a hydrogen atom, a methyl group, or a ethyl group, and the substituent $R^3$ can be selected according to the number of carbon atoms of the substituents $X^2$ to $X^5$. For example, in the case where the number of carbon atoms of the substituents $X^2$ to $X^5$ is large, a hydrogen atom is selected as the substituent $R^3$, while in the case where the number of carbon atoms of the substituent $R^3$ is small, a methyl group or an ethyl group is selected as the substituent $R^3$.

In the meantime, as the substituent $X^1$ and the substituents $X^2$ to $X^5$ (Hereinbelow, these substituents will be correctively referred to as "substituents X"), a chemical structure represented by the following general formula (B4) may be selected instead of the chemical structures represented by the general formulas (B1) to (B3). In this case, in order to obtain a polymer by polymerization reaction at the substituents X, polycondensation reaction can be made in a state that phosgene represented by the chemical formula $COCl_2$ and/or its derivative is mediated between the substituents X to form a chemical structure represented by the following general formula (B5):

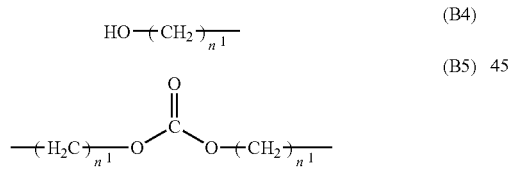

(B4)

(B5)

wherein each $n^1$ in these formulas independently represents an integer of 2 to 8, and these $n^1$s are the same or different.

Such a polymer has a structure in which the main skeletons are repeatedly existed through the chemical structure represented by the general formula (B5), that is a chemical structure in which two straight-chain carbon to carbon bonds (alkylene groups) are linked through a carbonate linkage. Because of the existence of such a chemical structure, in the same manner as the case where each of the chemical structures represented by the general formulas (B1) to (B3) is used, it is possible to allow the main skeletons to exist at a predetermined interval, thereby enabling interaction between the adjacent main skeletons to be decreased.

There is no specific limitation on the kind of phosgene and/or its derivative to be used if it is possible to form the chemical structure represented by the above-mentioned general formula (B5) by polycondensation reaction with the hydrokyl group at the end of each of the substituents X, but phosgene and/or its derivative which is mainly comprised of the compound represented by the following general formula (B6) are preferably used.

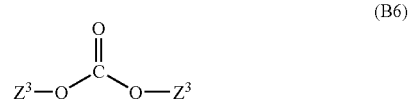

(B6)

where two $Z^3$ are the sama or different, and each independently represents an alkyl group, a phenyl group, or a benzyl group each having 1 to 6 carbon atoms.

When the substituents $X^1$ are allowed to make polycondensation reaction with phosgene and/or its derivative, a by-product material is produced. By using phosgene and/or the above-mentioned compound (B6) in the polycondensation reaction, it is possible to eliminate such a by-product material from a layer to be formed relatively easily. In this way, it is possible to prevent carriers from being captured by the by-product material in the layer to be formed. As a result, it is possible to prevent appropriately a carrier transport ability of the conductive layer from being decreased.

Now, a curing agent may be added to a polymer obtained from the compound (A1) or the compound (A2) as described above. Namely, polymerization reaction of the substituents X of the compound (A1) or the compound (A2) may be carried out via the curing agent.

Examples of such a curing agent include acryl-based curing agents, vinyl compounds such as divinylbenzene, and epoxy-based curing agents.

In this connection, in the case where the chemical structure represented by any one of the above-mentioned general formulas (B1) to (B3) is selected as the substituent X, it is particularly effective to make the polymerization reaction of the substituents X via the curing agent. This makes it possible to effectively prevent the interval between the main skeletons from becoming too small even in the case where a substituent having a relatively small number of carbon atoms, that is a substituent having a relatively short chain length is selected as the substituent X. As a result, since the interval between the main skeletons is maintained at a proper distance, it is possible to prevent reliably the interaction between the main skeletons from being increased.

In the case where the chemical structure represented by the above-mentioned general formula (B1) is selected as the substituent X, it is preferable to use at least one acryl-based curing agent selected from the group comprising a polyester (meth)acrylate curing agent, and epoxy(meth)acrylate curing agent, and a polyurethane(meth)acrylate curing agent and the like.

Examples of the polyester(meth)acrylate curing agent include the compounds represented by the following chemical formulas (F1) to (F3).

Examples of the epoxy(meth)acrylate curing agent include the compounds represented by the following chemical formulas (F4) to (F8).

Examples of the polyurethane (meth)acrylate curing agent include the compound represented by the following chemical formula (F9).

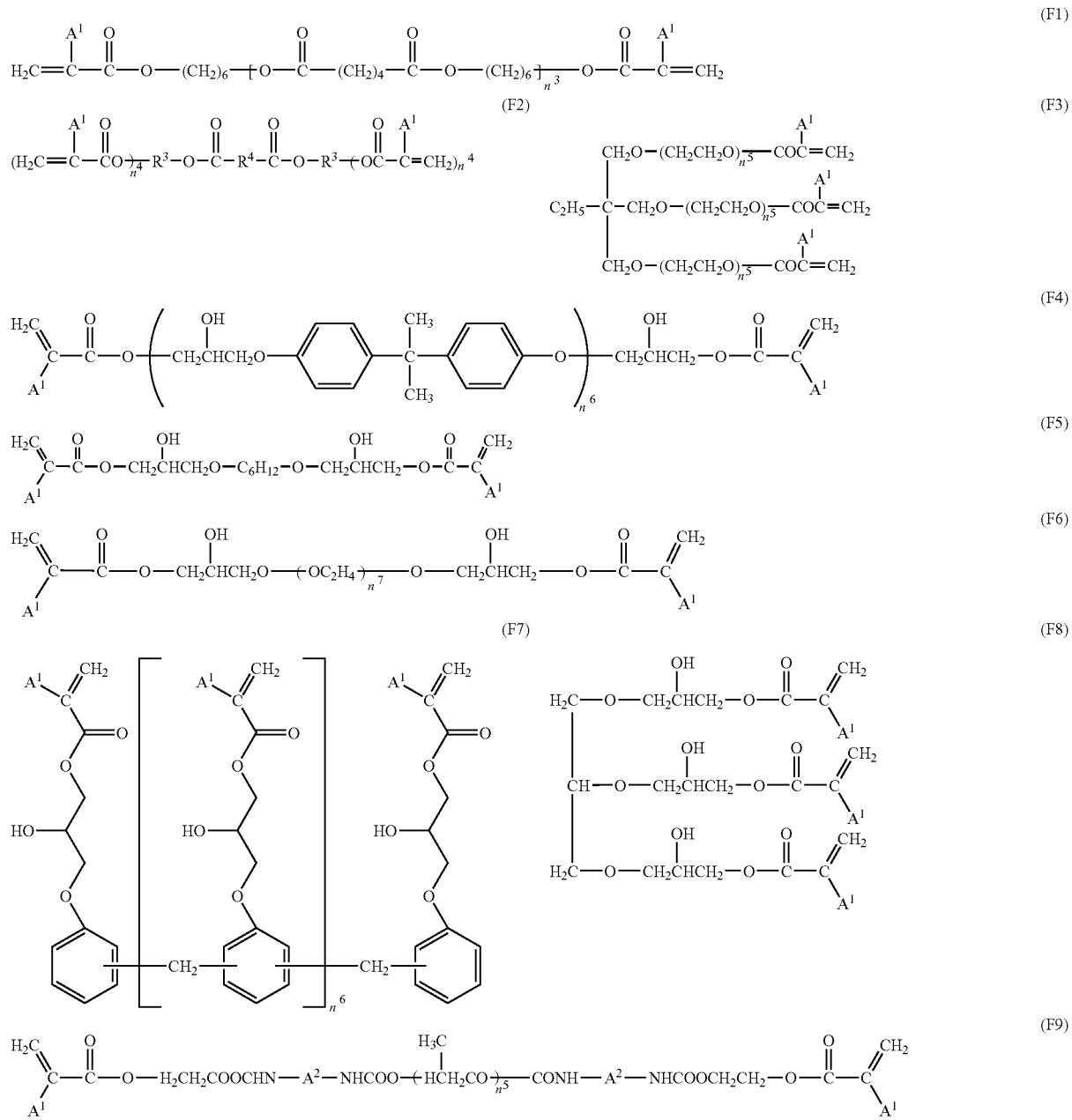

Note that in these general formulas, $n^3$ is an integer equal to or smaller than 4,500, $n^4$ is an integer of 1 to 3, and $n^5$ is an integer of 0 to 1500. $n^6$s are the same or different, and each independently represents an integer of 1 to 100. $n^7$ is an integer of 1 to 40, and $n^8$ is an integer of 1 to 100. $R^3$s are the same or different, and each independently represents an alkylene group having carbon atoms of 1 to 10, and $R^4$ represents an alkylene group having carbon atoms of 1 to 100. $A^1$s are the same or different, and each independently represents a hydrogen atom or a methyl group. $A^2$s are the same or different, and each independently represents a group obtained by removing two isocyanate groups from a diisocyanate compound.

Further, in the case where the chemical structure represented by the general formula (B2) is selected, it is preferable to use at least one of the following epoxy-based curing agents as the curing agent. Namely, examples of such epoxy-based curing agents include a (meth)acrylic ester-based epoxy cross-linking agent, a bisphenol epoxy cross-linking agent, a glycidyl ester-based epoxy cross-linking agent, an alicyclic epoxy cross-linking agent, an urethane modified epoxy cross-linking agent, a silicon-containing epoxy cross-linking agent, a polyfunctional phenol-based epoxy cross-linking agent and a glycidyl amine-based epoxy cross-linking agent.

As for such a (meth)acrylic ester-based epoxy cross-linking agent, the compound represented by the following general formula (G1) can be mentioned.

As for a bisphenol epoxy cross-linking agent, the compounds represented by the following general formulas (G2) to (G6) can be mentioned.

As for such a glycidyl ester-based epoxy cross-linking agent, the compounds represented by the following general formulas (G7) and (G8) can be mentioned.

As for such an alicyclic epoxy cross-linking agent, the compounds represented by the following general formulas (G9) to (G12) can be mentioned.

As for such an urethane modified epoxy, cross-linking agent, the compound represented by the following general formula (G13) can be mentioned.

As for such a silicon-containing epoxy cross-linking agent, the compound represented by the following general formula (G14) can be mentioned.

As for such a polyfunctional phenol-based epoxy cross-linking agent, the compounds represented by the following general formulas (G15) to (G22) can be mentioned.

As for such a glycidyl amine-based epoxy cross-linking agent, the compounds represented by the following general formulas (G23) to (G25) can be mentioned.

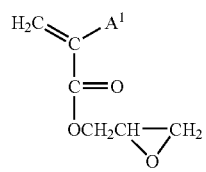

(G1)

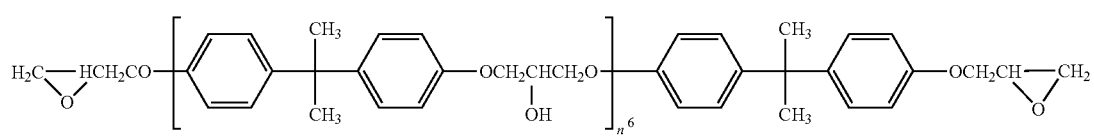

(G2)

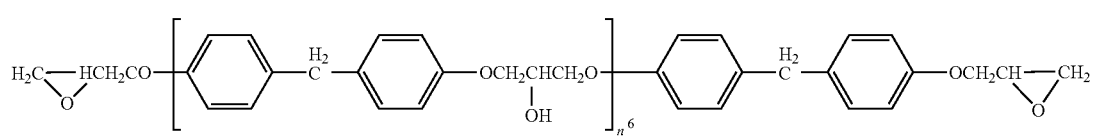

(G3)

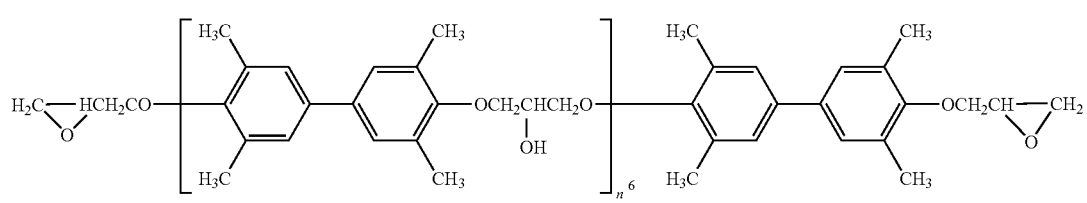

(G4)

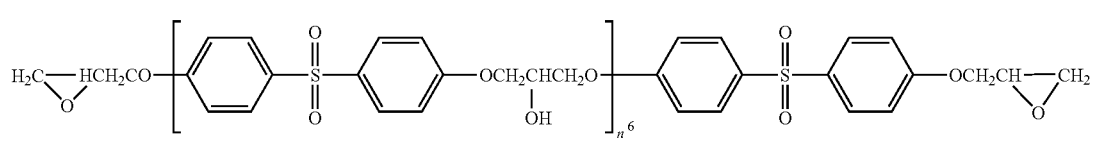

(G5)

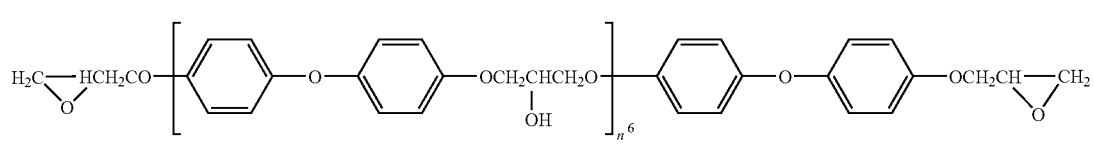

(G6)

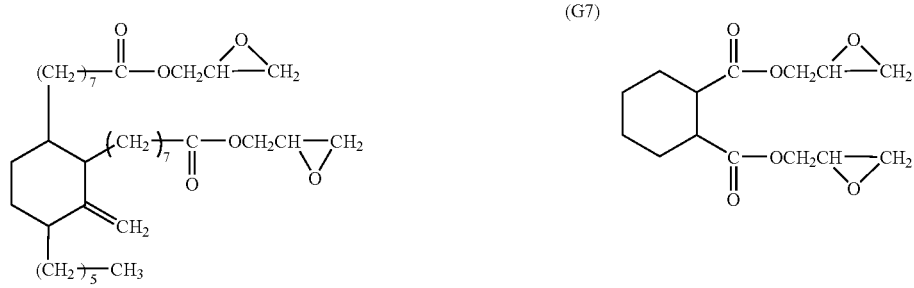

(G7)

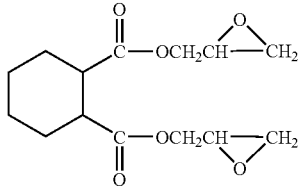

(G8)

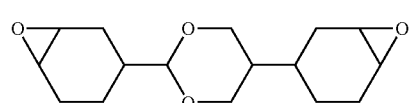

(G9) (G10)

-continued
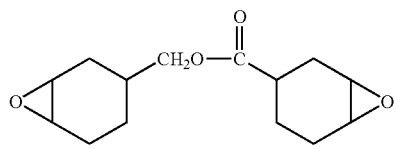 (G11)
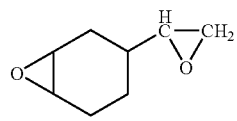 (G12)
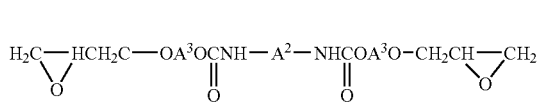 (G13)
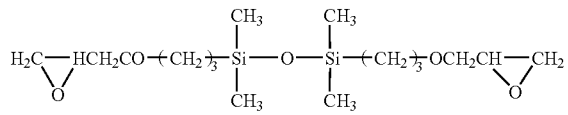 (G14)
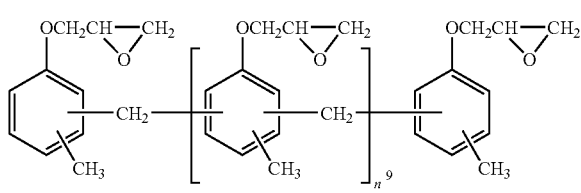 (G15)
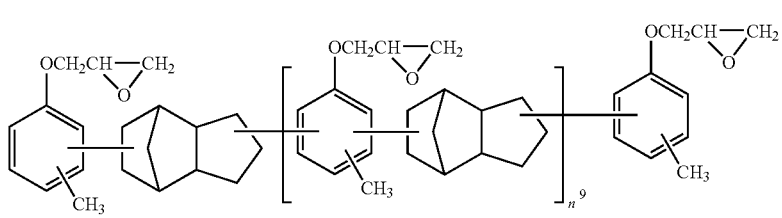 (G16)
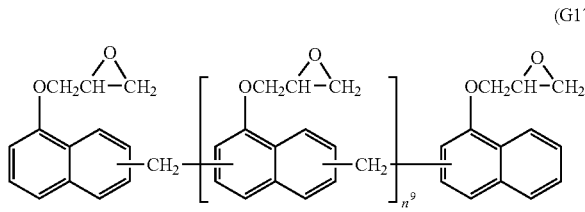 (G17)
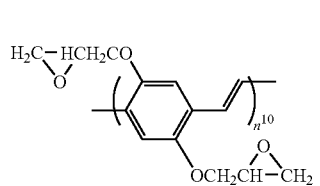 (G18)
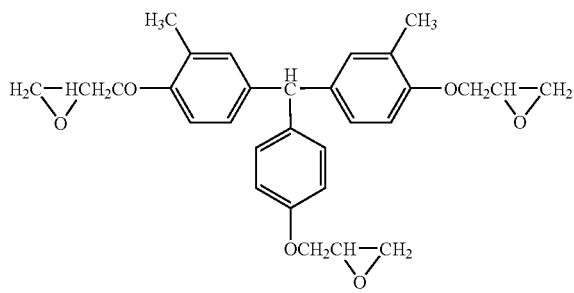 (G19)
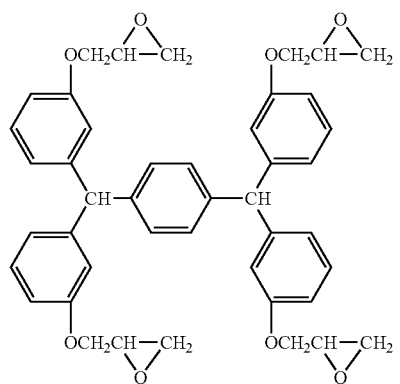 (G20)

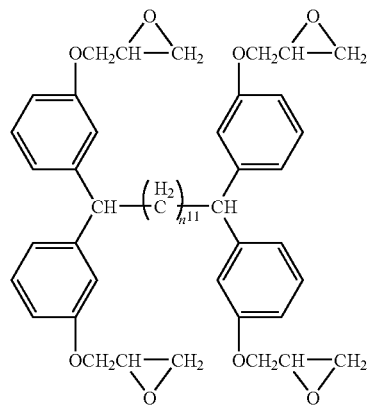 (G21)

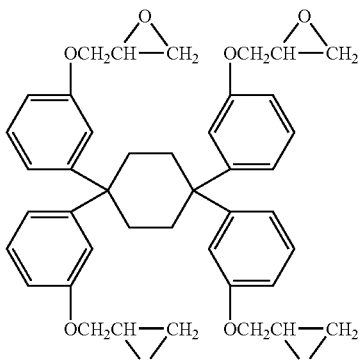 (G22)

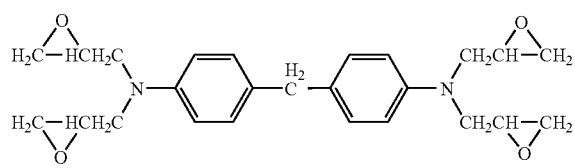 (G23)

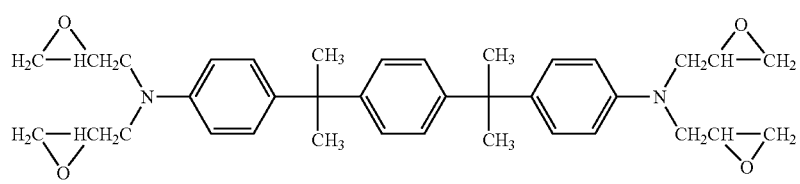 (G24)

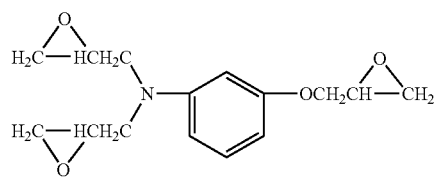 (G25)

Note that in these general formulas, $A^1$ represents a hydrogen atom or a methyl group. $n^6$s are the same or different, and each independently represents an integer of 0 to 10, and $n^9$s are the same or different, and each independently represents an integer of 1 to 20. $n^{10}$ represents an integer of 1 to 30, and $n^{11}$ is an integer of 0 to 8. $R^3$s are the same or different, and each independently represents an alkylene group having carbon atoms of 1 to 10, and $R^4$ represents an alkylene group having carbon atoms of 1 to 100. $A^2$ independently represents a group obtained by removing two isocyanate groups from a diisocyanate compound, and $A^3$s are the same or different, and each independently represents a group obtained by removing two isocyanate groups from a diisocyanate compound.

In the case where the chemical structure represented by the above-mentioned general formula (B3) is selected as the substituent X, it is preferable to use at least one vinyl compound such as polyethyleneglycoldi(meth)acrylate which is represented by the hollowing general formulas (H1) and divinylbenzene.

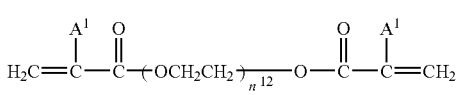 (H1)

wherein $n^{12}$ represents an integer of 5 to 15, and $A^1$s are the same or different, and each independently represents a hydrogen atom or a methyl group.

(Electronic Device)

Hereinbelow, a description will be made based on one example where the electronic device according to the present invention is applied to a display device.

Figure 4:
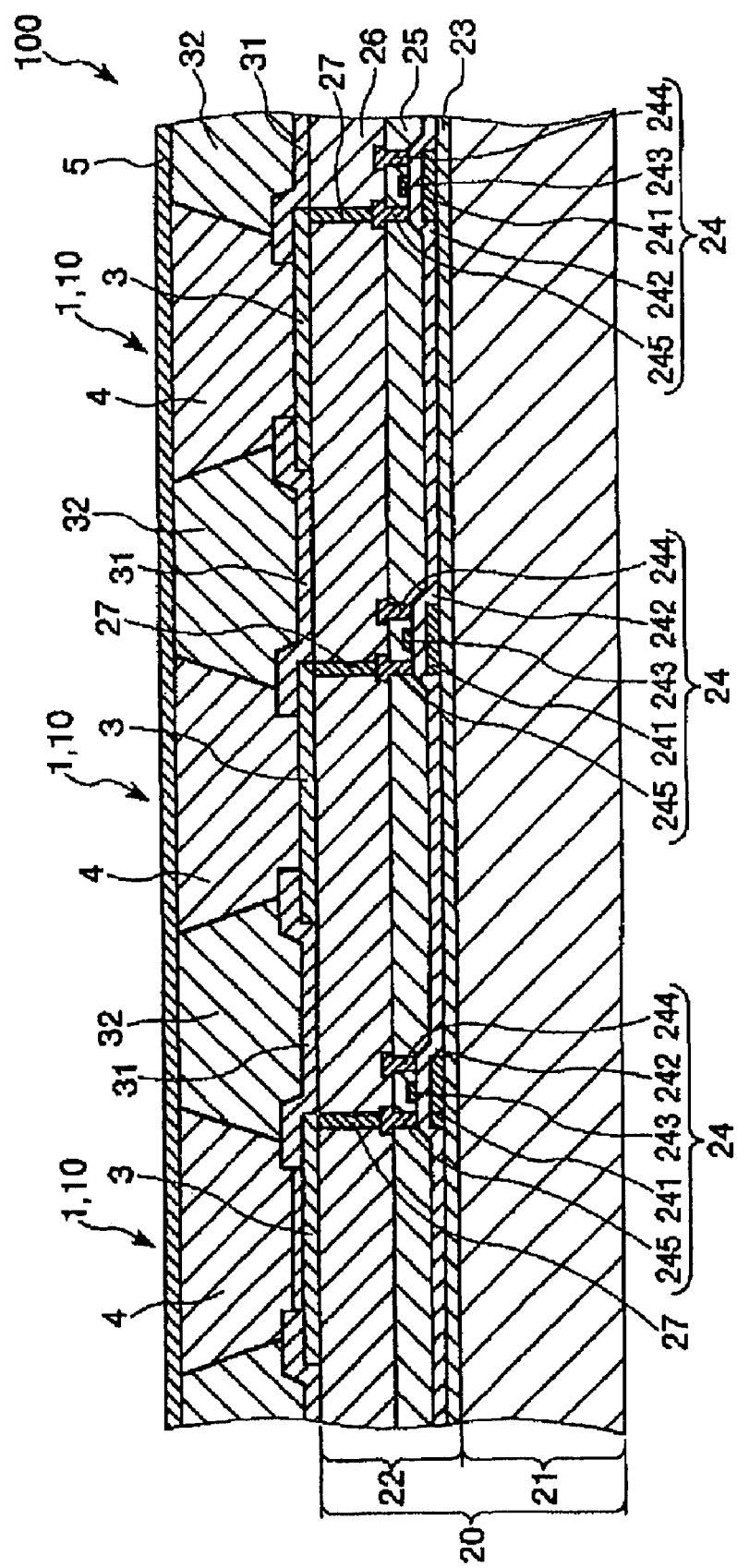
FIG. 4 is a cross-sectional view of an embodiment of an electronic device according to the present invention, which is directed to a case where the electronic device is applied to a display device.

FIG. 4 is a cross-sectional view of an embodiment of an electronic device according to the present invention, which is directed to a case where the electronic device is applied to a display device.

As shown in FIG. 4, a display device 100 includes a base 20 and a plurality of EL elements 1, 10 provided on the base 20.

The base 20 includes a substrate 21 and a circuit section 22 formed on the substrate 21. The circuit section 22 includes a protective layer 23 provided on the substrate 21 and formed from a titanium oxide layer, a driving TFT (switching element) 24 formed on the protective layer 23, a first insulation layer 25, and a second insulation layer 26.

The driving TFT 24 includes a semiconductor layer 241 made of a silicon, a gate insulation layer 242 formed on the semiconductor layer 241, a gate electrode 243 formed on the gate insulation layer 242, a source electrode 244, and a drain electrode 245.

The EL elements 1, 10 are provided on the circuit section 22 having the above structure so as to be associated with the respective driving TFTs 24. Further, the adjacent EL elements 1, 10 are partitioned by the first partitioning wall portion 31 and a second partitioning wall portion 32.

In this embodiment, an electrode of each EL element 1, 10 constitutes a pixel electrode, and it is electrically connected to the drain electrode 245 of the corresponding driving TFT 24 through the wiring 27. Further, the cathode electrodes of the respective EL elements are formed into a common electrode. Furthermore, a seal member (not shown in the drawing) is joined to the base 20 so as to cover the respective EL elements 1, 10 to thereby seal the EL elements 1, 10.

The display device 100 may be formed into a single color display type, but the display device 100 can display a color image by selecting light emitting materials used for the respective EL elements 1, 10.

(Electronic Equipment)

The display device 100 described above (that is, an electronic device according to the present invention) can be used for various electronic equipment.

Figure 5:
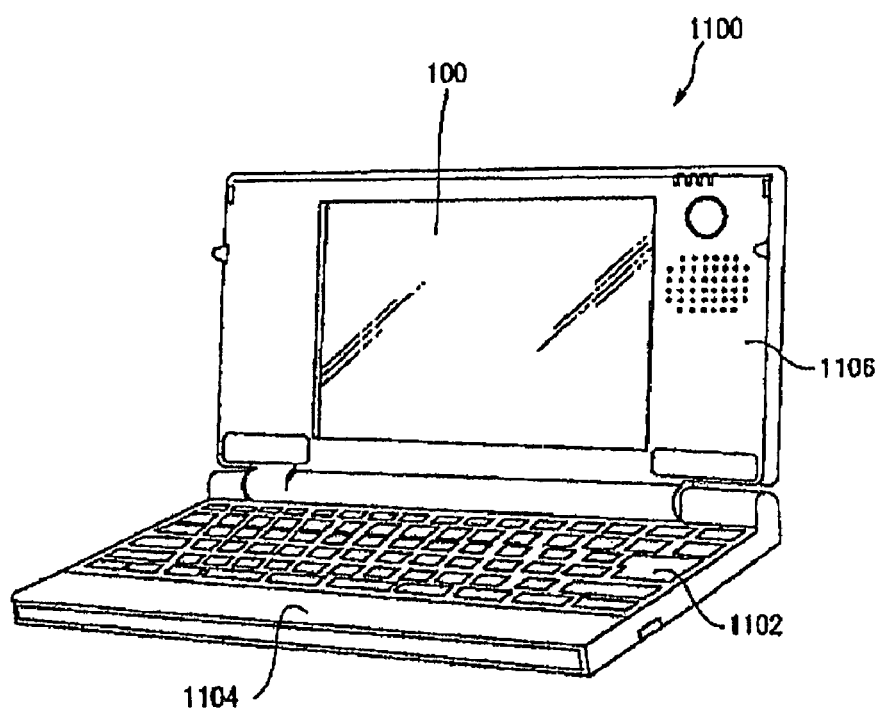
FIG. 5 is a perspective view which shows the structure of a personal mobile computer (or a personal notebook computer) which is one example of the electronic equipment according to the present invention.

FIG. 5 is a perspective view which shows the structure of a personal mobile computer (or a personal notebook computer) which is one example of the electronic equipment according to the present invention.

In FIG. 5, a personal computer 1100 is comprised of a main body 1104 provided with a keyboard 1102 and a display unit 1106 provided with a display (screen). The display unit 1106 is rotatably supported by the main body 1104 via a hinge structure.

In the personal computer 1100, the display (screen) of the display unit 1106 is constructed from the display device 100 described above.

Figure 6:
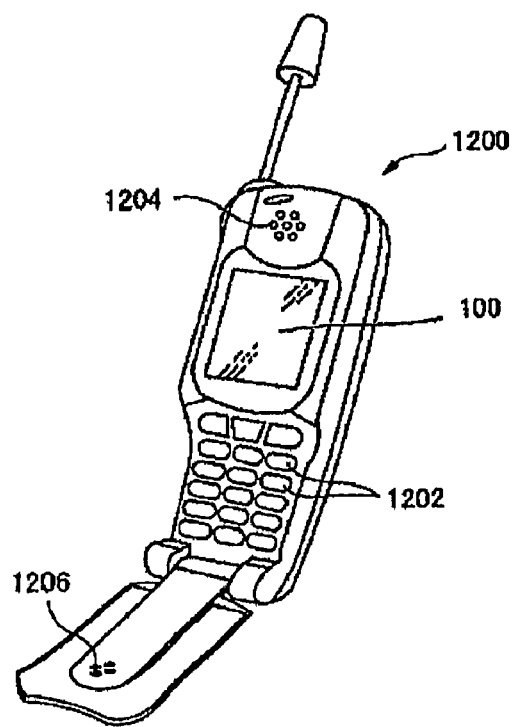
FIG. 6 is a perspective view which shows the structure of a mobile phone (including the personal handyphone system (PHS)) which is the other example of the electronic equipment according to the present invention.

FIG. 6 is a perspective view which shows the structure of a mobile phone (including the personal handyphone system (PHS)) which is the other example of the electronic equipment according to the present invention.

The mobile phone 1200 shown in FIG. 6 includes a plurality of operation buttons 1202, an earpiece 1204, a mouthpiece 1206, and a display.

In this mobile phone 1200, the display is constructed from the display device 100 as described above.

Figure 7:
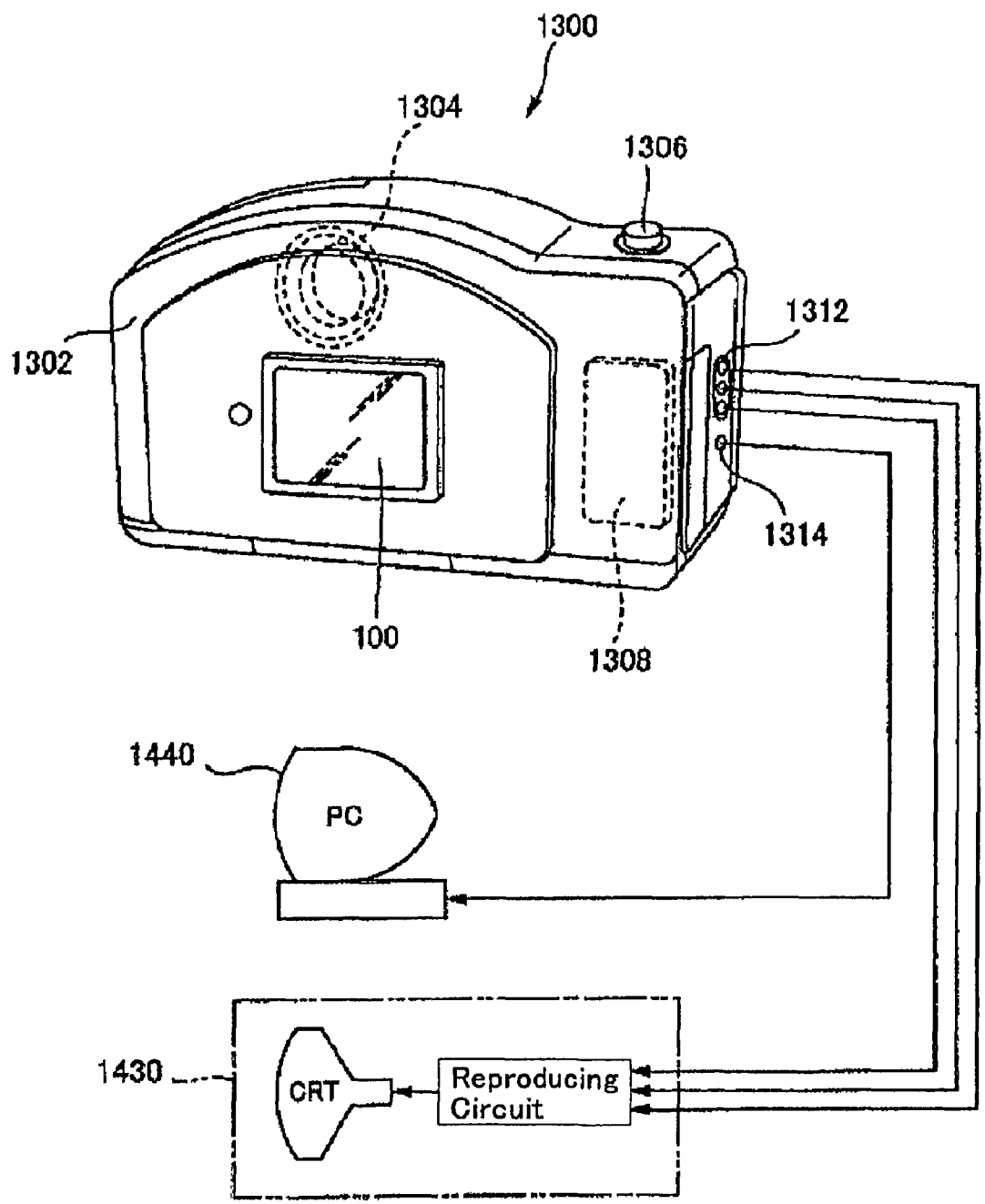
FIG. 7 is a perspective view which shows the structure of a digital still camera which is still other example of the electronic equipment according to the present invention.

FIG. 7 is a perspective view which shows the structure of a digital still camera which is still other example of the electronic equipment according to the present invention. In this drawing, interfacing to external devices is simply illustrated.

In a conventional camera, a silver salt film is exposed to the optical image of an object. On the other hand, in the digital still camera 1300, an image pickup device such as a CCD (Charge Coupled Device) generates an image pickup signal (or an image signal) by photoelectric conversion of the optical image of an object.

In the rear surface of a case (or a body) 1302 of the digital still camera 1300, there is provided a display which provides an image based on the image pickup signal generated by the CCD. That is, the display functions as a finder which displays the object as an electronic image.

In this digital still camera 1300, the display is constructed from the display device 100 as described above.

In the inside of the case, there is provided a circuit board 1308. The circuit board 1308 has a memory capable of storing an image pickup signal.

In the front surface of the case 1302 (in FIG. 7, the front surface of the case 1302 is on the back side), there is provided a light receiving unit 1304 including an optical lens (an image pickup optical system) and a CCD.

When a photographer presses a shutter button 1306 after checking an object image on the display, an image pickup signal generated by the CCD at that time is transferred to the memory in the circuit board 1308 and then stored therein.

Further, in the side surface of the case 1302 of the digital still camera 1300, there are provided a video signal output terminal 1312 and an input-output terminal for data communication 1314. As shown in FIG. 7, when necessary, a television monitor 1430 and a personal computer 1440 are connected to the video signal output terminal 1312 and the input-output terminal for data communication 1314, respectively. In this case, an image pickup signal stored in the memory of the circuit board 1308 is outputted to the television monitor 1430 or the personal computer 1440 by carrying out predetermined operations.

The electronic equipment according to the present invention can be applied not only to the personal computer (which is a personal mobile computer) shown in FIG. 5, the mobile phone shown in FIG. 6, and the digital still camera shown in FIG. 7 but also to a television set, a video camera, a view-finer or monitor type of video tape recorder, a laptop-type personal computer, a car navigation device, a pager, an electronic notepad (which may have communication facility), an electronic dictionary, an electronic calculator, a computerized game machine, a word processor, a workstation, a videophone, a security television monitor, an electronic binocular, a POS terminal, an apparatus provided with a touch panel (e.g., a cash dispenser located on a financial institute, a ticket vending machine), medical equipment (e.g., an electronic thermometer, a sphygmomanometer, a blood glucose meter, an electrocardiograph monitor, ultrasonic diagnostic equipment, an endoscope monitor), a fish detector, various measuring instruments, gages (e.g., gages for vehicles, aircraft, and boats and ships), a flight simulator, various monitors, and a projection display such as a projector.

The semiconductor layer formation material, the semiconductor element manufacturing method, the semiconductor element, the electronic device, and the electronic equipment according to the present invention have been described based on the embodiments shown in the drawings, but the present invention is not limited thereto.

For example, the semiconductor element according to the present invention may be applied to a photoelectric conversion element and a thin film transistor in addition to the EL device (element).

EXAMPLES

Next, the present invention will be described with reference to actual examples.

1. Synthesis of Compound

First, compounds (A) to (I) described below were prepared.

<Compound (A)>

1 mol of 4-hexyl aniline was dissolved in 150 mL of acetic acid, and acetic anhydride was dropped therein at room temperature and then they were stirred. After the completion of the reaction, a solid matter precipitated was filtered and then dried after washing with water to obtain a dry substance.

Next, 0.37 mol of the thus obtained substance, 0.66 mol of 1-bromo-4-hexylbenzene, 1.1 mol of potassium carbonate, copper powder, and iodine were mixed, and the mixture was heated at a temperature of 200° C. After the heated mixture was cooled down, 130 mL of isoamyl alcohol, 50 mL of pure water and 0.73 mol of potassium hydroxide were added to the mixture, and it was stirred and then dried to thereby obtain a compound.

Next, 130 mmol of the thus obtained compound, 62 mmol of 4,4'-diiodobiphenyl, 1.3 mmol of palladium acetate, 5.2 mmol of t-butylphosphine, 260 mmol of sodium t-butoxide, and 700 mL of xylene were mixed, and then they were stirred at a temperature of 120° C. Thereafter, the mixture was cooled for crystallization.

Then, the thus obtained compound was confirmed to be the following compound (A) by means of a mass spectrum (MS) method, a $^1$H-nuclear magnetic resonance ($^1$H-NMR) spectrum method, a $^{13}$C-nuclear magnetic resonance ($^{13}$C-NMR) spectrum method, and a Fourier transform infrared absorption (FT-IR) spectrum method.

<Compound (B)>

6-(p-aminophenyl)hexanol was treated with 4-methoxybenzylbromide and sodium hydride in anhydrous dimethylformamide to transform hydroxyl groups into benzyl ether groups and then it was protected.

Next, 1 mol of the obtained compound was dissolved in 150 mL of acetic acid, and acetic anhydride was dropped therein at room temperature and then they were stirred. After the completion of the reaction, a solid matter precipitated was filtered and then dried after washing with water.

Next, 0.37 mol of the thus obtained substance, 0.66 mol of 1-bromo-4-hexylbenzene, 1.1 mol of potassium carbonate, copper powder, and iodine were mixed and heated at a temperature of 200° C. After the mixture was cooled down, 130 mL of isoamyl alcohol, 50 mL of pure water, and 0.73 mol of potassium hydroxide were added to the mixture, and then they were stirred and dried.

Further, 130 mmol of the thus obtained compound, 62 mmol of 4,4'-diiodobiphenyl, 1.3 mmol of palladium acetate, 5.2 mmol of t-butylphosphine, 260 mmol of sodium t-butoxide, and 700 mL of xylene were mixed, and then they were stirred at a temperature of 120° C. Thereafter, the mixture was cooled for crystallization.

The thus obtained compound was then reduced by hydrogen gas using Pd—C catalyst so that transformation was made from the benzyl ether groups to the hydroxyl groups to carry out deprotection.

Next, 100 mmol of the compound and 2000 mmol of epichlorohydrin were added to 50% of sodium hydroxide solution to which a small amount of a hydrogen sulphate of tetra-n-butylammonium (phase transfer catalyst) had been added, and then they were stirred for 10 hours at room temperature. Thereafter, the mixture was cooled for crystallization to obtain a compound.

Then, the thus obtained compound was confirmed to be the following compound (B) by means of the MS method, the $^1$H-NMR method, the $^{13}$C-NMR method, and the FT-IR method.

<Compound (C)>

6-(p-aminophenyl)hexanol was treated with 4-methoxybenzylbromide and sodium hydride in anhydrous dimethylformamide to transform hydroxyl groups into benzyl ether groups and then it was protected.

Next, 1 mol of the thus obtained compound was dissolved in 150 mL of acetic acid, and acetic anhydride was dropped therein at room temperature and then they were stirred. After the completion of the reaction, a solid matter precipitated was filtered and then dried after washing with water.

Next, 6-(p-bromophenyl)hexanol was subjected to the same treatment as that for 6-(p-aminophenyl)hexanol to transform hydroxyl groups into benzyl ether groups and then it was protected to obtain a dry substance (benzyl ether derivative).

Next, 0.37 mol of benzyl ether derivative obtained from 6-(p-aminophenyl)hexanol, 0.66 mol of benzyl ether derivative obtained from 6-(p-bromophenyl)hexanol, 1.1 mol of potassium carbonate, copper powder, and iodine were mixed and heated at a temperature of 200° C. After the mixture was cooled down, 130 mL of isoamyl alcohol, 50 mL of pure water, and 0.73 mol of potassium hydroxide were added to the mixture, and then they were stirred and dried.

Further, 130 mmol of the thus obtained compound, 62 mmol of 4,4'-diiodobiphenyl, 1.3 mmol of palladium acetate, 5.2 mmol of t-butylphosphine, 260 mmol of sodium t-butoxide, and 700 mL of xylene were mixed, and then they were stirred at a temperature of 120° C. Thereafter, the mixture was cooled for crystallization.

The thus obtained compound was reduced by hydrogen gas using a Pd—C catalyst so that transformation was made from the benzyl ether groups to the hydroxyl groups to carry out deprotection.

Next, 100 mmol of the thus obtained compound and 2000 mmol of epicholorohydrin were added to 50% of sodium hydroxide solution to which a small amount of tetra-n-butylammonium hydrogen sulphate (phase transfer catalyst) had been added, and then they were stirred for 10 hours at room temperature. Thereafter, the mixture was cooled for crystallization to obtain a compound.

Then, the thus obtained compound was confirmed to be the following compound (C) by means of the MS method, the $^1$H-NMR method, the $^{13}$C-NMR method, and the FT-IR method.

<Compound (D)>

A compound (D) was obtained in the same manner as the compound (C) except that 4,4'-diiodobiphenyl was changed to 2,5-bis(4-iodophenyl)-thiophene.

<Compound (E)>

A compound (E) was obtained in the same manner as the compound (C) except that 4,4'-diiodobiphenyl was changed to 3,5-diiodo-1,2,4-triazole.

<Compound (F)>

As the following compound (F), N,N,N',N'-tetrakis(4-methylphenyl)-benzidine ("OSA 6140", produced by TOSCO CO., LTD.) was prepared.

<Compound (G)>

As the following compound (G), poly(3,4-ethylenedioxythiophene/styrenesulfonic acid) ("BAYTRON P CH800", produced by Bayer AG) was prepared.

<Compound (H)>

As the following compound (H), poly(9,9-dioctyl-2,7-divinylenefluorenyl-ortho-co(anthracene-9,10-diyl) (produced by American Dye Source, Ltd.) was prepared.

<Compound (I)>

As the following compound (I), 3,5-bis(4-tert-butyl-phenyl),4-phenyl-1,2,4-triazole ("OPA 2938", produced by TOSCO CO., LTD.) was prepared.

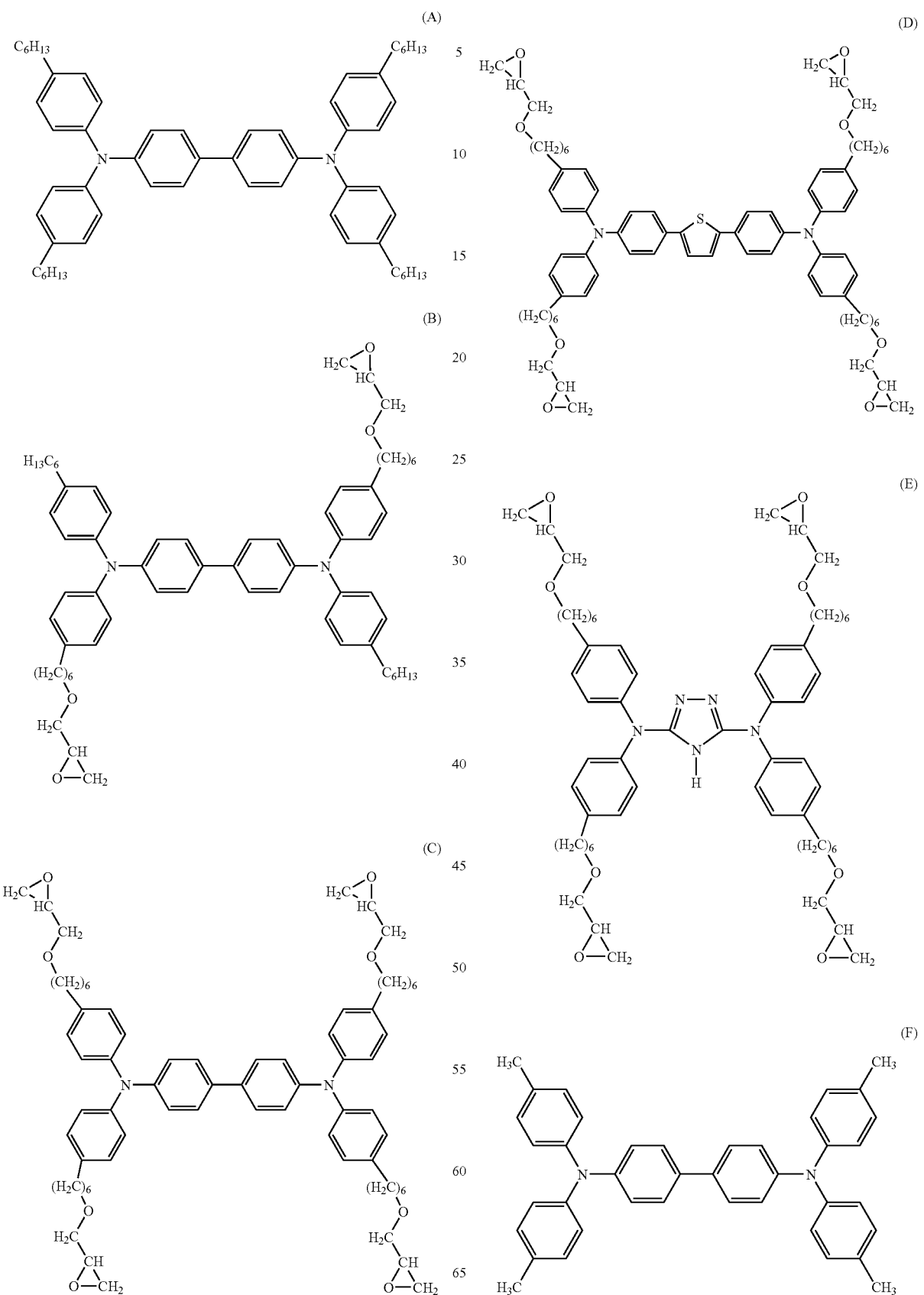

-continued

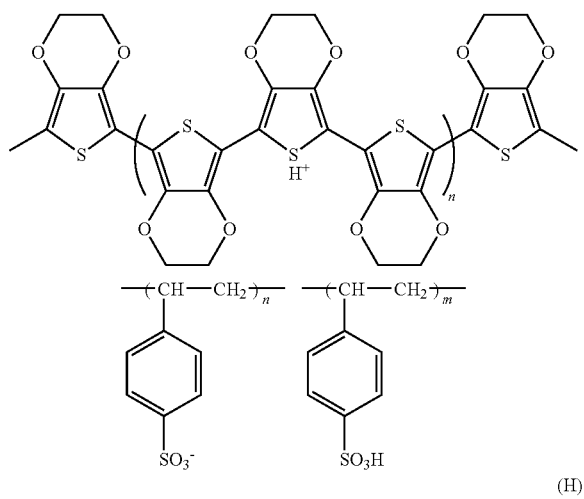

2. Manufacture of EL Device

Five EL devices were manufactured in each of the following Examples and Comparative Examples.

Example 1A

Preparation of Hole Transport Layer Formation Material

Fine particles made of $SiO_2$ (hereinafter, referred to as $SiO_2$ fine particles) and having an average particle size of 25 nm (produced by C.I. KASEI CO., LTD) were used as the porous particles and the compound (A) was used as the hole transport material, and the $SiO_2$ fine particles and the compound (A) in a weight ratio of 1:9 were mixed in a xylene solution to prepare a hole transport layer formation material.

<Manufacture of EL Device>

1A First, an ITO electrode (that is, an anode) was formed on a transparent glass substrate having an average thickness of 0.5 mm by vacuum evaporation so as to have an average thickness of 100 nm.

2A Next, the hole transport layer formation material was applied onto the ITO electrode by a spin coating method, and was then dried to form a hole transport layer having an average thickness of 50 nm.

3A Next, a xylene solution of the compound (H) was applied onto the hole transport layer by a spin coating method, and was then dried to form a light emitting layer having an average thickness of 50 nm.

4A Next, an electron transport layer having an average thickness of 20 nm was formed on the light emitting layer by vacuum evaporation of the compound (I).

5A Next, an AlLi electrode (that is, a cathode) was formed on the electron transport layer by vacuum evaporation so as to have an average thickness of 300 nm.

6A Next, a protection cover made of polycarbonate was provided so as to cover these layers described above, and was then secured and sealed with an ultraviolet curable resin to obtain an EL device.

Examples 2A and 3A

In each of Examples 2A and 3A, EL devices were manufactured after a hole transport material was prepared in the same manner as in the Example 1A except that the mixing ratio of the $SiO_2$ fine particles and the compound (A) was changed to those shown in Table 1.

Example 4A

Preparation of Hole Transport Layer Formation Material $SiO_2$ fine particles having an average particle size of 25 nm (produced by C.I. KASEI CO., LTD), the compound (B), and a cationic photopolymerization initiator ("FC-508" produced by SUMITOMO BAKELITE Co., LTD) in a weight ratio of 10:89:1 were mixed in a xylene solution to prepare a hole transport layer formation material.

<Manufacture of EL Device>

EL devices were manufactured in the same manner as in Example 1A except that, after the above-mentioned step 2A, the hole transport layer formation material was irradiated with ultraviolet rays having a wavelength of 365 nm from a mercury lamp ("UM-452", USHIO Inc.) through a filter at an intensity of irradiation of 500 mW/cm² for 15 seconds in the dry atmosphere and then it was heated at a temperature of 110° C. for 60 minutes to cure the compound (B), so that a hole transport layer having an average thickness of 50 nm was formed.

Examples 5A and 6A

In each of Examples 5A and 6A, EL devices were manufactured after a hole transport material was prepared in the same manner as in the Example 4A except that as the hole transport material was changed to those shown in Table 1A.

Examples 7A and 8A

In each of Examples 7A and 8A, EL devices were manufactured after a hole transport material was prepared in the same manner as in the Example 1A except that the mixing ratio of the $SiO_2$ fine particles and the hole transport material was changed to those shown in Table 1A.

Example 9A

Preparation of Hole Transport Layer Formation Material $SiO_2$ fine particles having an average particle size of 25 nm (produced by C.I. KASEI CO., LTD) and the compound (G)

in a weight ratio of 1:9 were mixed in pure water to prepare a hole transport layer formation material.

In this regard, it is to be noted that in the compound (G) the ratio of 3,4-ethylenedioxythiophene with respect to styrenesulfonic acid contained was 1:20 in weight ratio.

<Manufacture of EL Device>

EL devices were manufactured in the same manner as in Example 1A except that for forming the hole transport layer in the above-mentioned step 2A, the hole transport layer formation material obtained in this Example was used.

Example 10A

EL devices were manufactured after a hole transport material was prepared in the same manner as in the Example 1A except that $SiO_2$ fine particles having an average particle size of 31 nm (produced by C.I. KASEI CO., LTD) were used.

Example 11A

EL devices were manufactured after a hole transport material was prepared in the same manner as in the Example 3A except that $SiO_2$ fine particles having an average particle size of 31 nm (produced by C.I. KASEI CO., LTD) were used.

Example 12A

EL devices were manufactured after a hole transport material was prepared in the same manner as in the Example 7A except that $SiO_2$ fine particles having an average particle size of 31 nm (produced by C.I. KASEI CO., LTD) were used.

Example 13A

EL devices were manufactured after a hole transport material was prepared in the same manner as in the Example 8A except that $SiO_2$ fine particles having an average particle size of 31 nm (produced by C.I. KASEI CO., LTD) were used.

Example 14A

EL devices were manufactured after a hole transport material was prepared in the same manner as in the Example 9A except that $SiO_2$ fine particles having an average particle size of 31 nm (produced by C.I. KASEI CO., LTD) were used.

Example 15A

EL devices were manufactured after a hole transport material was prepared in the same manner as in the Example 1A except that no electron transport layer was formed by omitting the above-mentioned step 4A.

Example 16A

EL devices were manufactured after a hole transport material was prepared in the same manner as in the Example 4A except that no electron transport layer was formed by omitting the above-mentioned step 4A.

Example 17A

EL devices were manufactured after a hole transport material was prepared in the same manner as in the Example 5A except that no electron transport layer was formed by omitting the above-mentioned step 4A.

Example 18A

EL devices were manufactured after a hole transport material was prepared in the same manner as in the Example 6A except that no electron transport layer was formed by omitting the above-mentioned step 4A.

Example 19A

EL devices were manufactured after a hole transport material was prepared in the same manner as in the Example 7A except that no electron transport layer was formed by omitting the above-mentioned step 4A.

Example 20A

EL devices were manufactured after a hole transport material was prepared in the same manner as in the Example 9A except that no electron transport layer was formed by omitting the above-mentioned step 4A.

Example 1B

Preparation of Light Emitting Layer Formation Material $SiO_2$ fine particles having an average particle size of 25 nm (produced by C.I. KASEI CO., LTD) were used as the porous particles and the compound (H) was used as the light emitting material, and the $SiO_2$ fine particles and the compound (H) in a weight ratio of 1:9 were mixed in a xylene solution to prepare a light emitting layer formation material.

<Manufacture of EL Device>

1B First, an ITO electrode was formed in the same manner as the above-mentioned step 1A.

2B Next, a xylene solution of the compound (F) was applied onto the ITO electrode by a spin coating method, and was then dried to form a hole transport layer having an average thickness of 50 nm.

3B Next, the light emitting layer formation material was applied onto the hole transport layer by a spin coating method, and was then dried to form a light emitting layer having an average thickness of 50 nm.

4B Next, a xylene solution of the compound (I) was applied onto the light emitting layer by a spin coating method, and was then dried to form an electron transport layer having an average thickness of 20 nm.

5B Next, an AlLi electrode (that is, a cathode) was formed on the electron transport layer in the same manner as the above-mentioned step 5A.

6B Next, in the same manner as the above-mentioned step 6A, a protection cover was provided so as to cover these layers described above, and was then secured and sealed to obtain an EL device.

Examples 2B and 3B

In each of Examples 2B and 3B, EL devices were manufactured after a light emitting layer formation material was prepared in the same manner as in the Example 1B except that the mixing ratio of the $SiO_2$ fine particles and the compound (H) was changed to those shown in Table 1B.

Example 4B

EL devices were manufactured after a light emitting layer formation material was prepared in the same manner as in the Example 1B except that fine particles made of $Al_2O_3$ and having an average particle size of 31 nm (produced by C.I. KASEI CO., LTD) was used as the porous fine particles.

Example 1C

Preparation of Hole Transport Layer Formation Material

A hole transport layer formation material which is the same as that used in the Example 1A was prepared.
<Preparation of Light Emitting Layer Formation Material>
A light emitting layer formation material which is the same as that used in the Example 1B was prepared.
<Manufacture of EL Device>
1C First, an ITO electrode was formed in the same manner as the above-mentioned step 1A.
2C Next, a hole transport layer was formed in the same manner as the above-mentioned step 2A.
3C Next, a light emitting layer was formed in the same manner as the above-mentioned step 3B.
4C Next, an electron transport layer was formed in the same manner as the above-mentioned step 4B.
5C Next, an AlLi electrode (cathode) was formed in the same manner as the above-mentioned step 5A.
6C Next, in the same manner as the above-mentioned step 6A, a protection cover was provided so as to cover these layers described above, and was then secured and sealed to obtain an EL device.

Example 2C

Preparation of Hole Transport Layer Formation Material

A hole transport layer formation material which is the same as that used in the Example 4A was prepared.
<Preparation of Light Emitting Layer Formation Material>
A light emitting layer formation material which is the same as that used in the Example 1B was prepared.
<Manufacture of EL Device>
1C First, an ITO electrode was formed in the same manner as the above-mentioned step 1A.
2C Next, after the above-mentioned step 2A, the hole transport layer formation material was irradiated with ultraviolet rays having a wavelength of 365 nm from a mercury lamp ("UM-452", USHIO Inc.) through a filter at an intensity of irradiation of 500 mW/cm$^2$ for 15 seconds in the dry atmosphere and then it was heated at a temperature of 110° C. for 60 minutes to cure the compound (B), so that a hole transport layer having an average thickness of 50 nm was formed.
3C Next, a light emitting layer was formed in the same manner as the above-mentioned step 3B.
4C Next, an electron transport layer was formed in the same manner as the above-mentioned step 4B.
5C Next, an AlLi electrode (cathode) was formed in the same manner as the above-mentioned step 5A.
6C Next, in the same manner as the above-mentioned step 6A, a protection cover was provided so as to cover these layers described above, and was then secured and sealed to obtain an EL device.

Embodiment 3C

Preparation of Hole Transport Layer Formation Material $SiO_2$ fine particles having an average particle size of 25 nm (produced by C.I. KASEI CO., LTD), the compound (D), and a cationic photopolymerization initiator ("FC-508" produced by SUMITOMO BAKELITE CO., LTD) in a weight ratio of 10:89:1 were mixed in a xylene solution to prepare a hole transport layer formation material.
<Preparation of Light Emitting Layer Formation Material>
A light emitting layer formation material which is the same as that used in the Example 1B was prepared.
<Preparation of Electron Transport Layer Formation Material>
The compound (E) and a cationic photopolymerization initiator ("FC-508") produced by SUMITOMO BAKELITE CO., LTD) in a weight ratio of 99:1 were mixed in a xylene solution to prepare an electron transport layer formation material.
<Manufacture of EL Device>
1C First, an ITO electrode was formed in the same manner as the above-mentioned step 1A.
2C Next, after the above-mentioned step 2A, the hole transport layer formation material was irradiated with ultraviolet rays having a wavelength of 365 nm from a mercury lamp ("UM-452", USHIO Inc.) through a filter at an intensity of irradiation of 500 mW/cm$^2$ for 15 seconds in the dry atmosphere and then it was heated at a temperature of 110° C. for 60 minutes to cure the compound (B), so that a hole transport layer having an average thickness of 50 nm was formed.
3C Next, a light emitting layer was formed in the same manner as the above-mentioned step 3B.
4C Next, a xylene solution of the compound (E) was applied onto the light emitting layer by a spin coating method and it was dried. Then, the electron transport layer formation material was irradiated with ultraviolet rays having a wavelength of 365 nm from a mercury lamp ("UM-452", USHIO Inc.) through a filter at an intensity of irradiation of 500 mW/cm$^2$ for 15 seconds in the dry atmosphere and then it was heated at a temperature of 110° C. for 60 minutes to cure the compound (E), so that an electron transport layer having an average thickness of 20 nm was formed.
5C Next, an AlLi electrode (cathode) was formed in the same manner as the above-mentioned step 5A.
6C Next, in the same manner as the above-mentioned step 6A, a protection cover was provided so as to cover these layers described above, and was then secured and sealed to obtain an EL device.

Embodiment 4C

EL devices were manufactured after a hole transport layer formation material and a light emitting layer formation material were prepared in the same manner as in the Example 1C except that fine particles made of $Al_2O_3$ and having an average particle size of 31 nm (produced by C.I. KASEI CO., LTD) were used as the porous fine particles.

Embodiment 1D

Preparation of Porous Particles Deposition Coating Formation Material $SiO_2$ fine particles having an average particle size of 25 nm (produced by C. I. KASEI CO., LTD) was mixed with kylene to prepare a porous particles deposition coating formation material.

<Manufacture of EL Device>

1D First, an ITO electrode was formed in the same manner as the above-mentioned step 1A.

2D Next, a xylene solution of the porous particles deposition coating formation material was applied onto the ITO electrode by a spin coating method, and was then dried to form a porous particles deposition coating having an average thickness of 50 nm.

3D Next, a xylene solution of the compound (A) was applied onto the ITO electrode by a spin coating method, and was then dried to form a hole transport layer having an average thickness of 50 nm.

4D Next, a light emitting layer was formed in the same manner as the above-mentioned step 3A.

5D Next, an electron transport layer was formed in the same manner as the above-mentioned step 4A.

6D Next, an AlLi electrode (that is, a cathode) was formed on the electron transport layer in the same manner as the above-mentioned step 5A.

7D Next, in the same manner as the above-mentioned step 6A, a protection cover was provided so as to cover these layers described above, and was then secured and sealed to obtain an EL device.

Embodiment 2D

EL devices were manufactured after a porous particles deposition coating formation material was prepared in the same manner as in Example 1D except that fine particles made of $Al_2O_3$ and having an average particle size of 31 nm (produced by C.I. KASEI CO., LTD) were used as the porous fine particles.

Embodiment 1E

Preparation of Porous Particles Deposition Coating Formation Material

Porous particles deposition coating formation material which is the same as that used in the Example 1A was prepared.

<Manufacture of EL Device>

1E First, an ITO electrode was formed in the same manner as the above-mentioned step 1A.

2E Next, a porous particles deposition coating was formed in the same manner as the above-mentioned step 2D.

3E Next, a hole transport layer was formed in the same manner as the above-mentioned step 3D.

4E Next, the porous particles deposition coating formation material was applied onto the hole transport layer by a spin coating method, and then it was dried to form a porous particles deposition coating having an average thickness of 50 nm.

5E Next, a xylene solution of the compound (H) was coated by a spin coating method, and then it was dried to form a light emitting layer having an average thickness of 50 nm.

6E Next, an electron transport layer was formed in the same manner as the above-mentioned step 4B.

7E Next, an AlLi electrode (that is, a cathode) was formed on the electron transport layer in the same manner as the above-mentioned step 5A.

8E Next, in the same manner as the above-mentioned step 6A, a protection cover was provided so as to cover these layers described above, and was then secured and sealed to obtain an EL device.

Embodiment 2E

EL devices were manufactured after a porous particles deposition coating formation material was prepared in the same manner as in Example 1A except that fine particles made of $Al_2O_3$ and having an average particle size of 31 nm (produced by C. I. KASEI CO., LTD) were used as the porous fine particles.

Comparative Example 1

EL devices were manufactured after a porous particles deposition coating formation material was prepared in the same manner as in the Example 1A except that no porous fine particles were added to the hole transport layer formation material.

Comparative Example 2

EL devices were manufactured after a porous particles deposited in a coating state formation material was prepared in the same manner as in the Example 7A except that no porous fine particles were added to the hole transport layer formation material.

Comparative Example 3

EL devices were manufactured after a porous particles deposited in a coating state formation material was prepared in the same manner as in the Example 9A except that no porous fine particles were added to the hole transport layer formation material.

3. Evaluation

The luminous brightness ($cd/m^2$), the maximum luminous efficiency (lm/W), and the time that elapsed before the luminous brightness became half of the initial value (that is, a half-life) of each of the EL devices obtained in the Examples and the Comparative Examples mentioned above were measured.

In this regard, it is to be noted that the luminous brightness was measured by applying a voltage of 6V across the ITO electrode and the AlLi electrode.

The measurement values (that is, the luminous brightness, the maximum luminous efficiency, and the half-life) of each of the Examples and the Comparative Examples were evaluated according to the following four criteria, respectively, based on the measurement values of the Comparative Example 3 as a reference.

A: The measurement value was 1.5 times or more that of the Comparative Example 3.

B: The measurement value was 1.25 times or more but less than 1.5 times that of the Comparative Example 3.

C: The measurement value was 1.00 times or more but less than 1.25 times that of the Comparative Example 3.

D: The measurement value was 0.75 times or more but less than 1.00 times that of the Comparative Example 3.

The evaluation results are shown in the attached Table 1A and Table 1B.

TABLE 1A

| | Hole Transport Layer | | Light Emitting Layer | | Electron Transport Layer Electron Transport Material | Maximum Luminous Brightness [Relative Evaluation] | Luminous Efficiency [Relative Evaluation] | Half-life [Relative Evaluation] |
|---|---|---|---|---|---|---|---|---|
| | Porous Particles/Hole Transport Material | Mixing Ratio (Weight Ratio) | Porous Particles/Light Emitting Material | Mixing Ratio (Weight Ratio) | | | | |
| Ex. 1A | $SiO_2$/(A) | 1:9 | —/(H) | — | (I) | A | A to B | A to B |
| Ex. 2A | $SiO_2$/(A) | 1:1 | —/(H) | — | (I) | A | A to B | A to B |
| Ex. 3A | $SiO_2$/(A) | 9:1 | —/(H) | — | (I) | B | B | B |
| Ex. 4A | $SiO_2$/(B) | 1:9 | —/(H) | — | (I) | A | A | A |
| Ex. 5A | $SiO_2$/(C) | 1:9 | —/(H) | — | (I) | A | A | A |
| Ex. 6A | $SiO_2$/(D) | 1:9 | —/(H) | — | (I) | A | A | A |
| Ex. 7A | $SiO_2$/(F) | 1:9 | —/(H) | — | (I) | A | A to B | A to B |
| Ex. 8A | $SiO_2$/(F) | 9:1 | —/(H) | — | (I) | B | B | B |
| Ex. 9A | $SiO_2$/(G) | 1:9 | —/(H) | — | (I) | B | B to C | B |
| Ex. 10A | $Al_2O_3$/(A) | 1:9 | —/(H) | — | (I) | A | A to B | A to B |
| Ex. 11A | $Al_2O_3$/(A) | 1:1 | —/(H) | — | (I) | B | B | B |
| Ex. 12A | $Al_2O_3$/(F) | 1:9 | —/(H) | — | (I) | A | A to B | A to B |
| Ex. 13A | $Al_2O_3$/(F) | 9:1 | —/(H) | — | (I) | B | B | B |
| Ex. 14A | $Al_2O_3$/(G) | 1:9 | —/(H) | — | (I) | B | B to C | B |
| Ex. 15A | $SiO_2$/(A) | 1:9 | —/(H) | — | | A | A to B | A to B |
| Ex. 16A | $SiO_2$/(B) | 1:9 | —/(H) | — | | A | A to B | A to B |
| Ex. 17A | $SiO_2$/(C) | 1:9 | —/(H) | — | | A | A to B | A |
| Ex. 18A | $SiO_2$/(D) | 1:9 | —/(H) | — | | A | A to B | A to B |
| Ex. 19A | $SiO_2$/(F) | 1:9 | —/(H) | — | | B | B to C | B |
| Ex. 20A | $SiO_2$/(G) | 1:9 | —/(H) | — | | B | B to C | B |

—: No Porous Particles are added.

TABLE 1B

| | Hole Transport Layer | | Light Emitting Layer | | Electron Transport Layer Electron Transport Material | Maximum Luminous Brightness [Relative Evaluation] | Luminous Efficiency [Relative Evaluation] | Half-life [Relative Evaluation] |
|---|---|---|---|---|---|---|---|---|
| | Porous Particles/Hole Transport Material | Mixing Ratio (Weight Ratio) | Porous Particles/Light Emitting Material | Mixing Ratio (Weight Ratio) | | | | |
| Ex. 1B | —/(F) | — | $SiO_2$/(H) | 1:9 | (I) | A to B | A to B | A to B |
| Ex. 2B | —/(F) | — | $SiO_2$/(H) | 1:1 | (I) | A to B | A to B | A to B |
| Ex. 3B | —/(F) | — | $SiO_2$/(H) | 9:1 | (I) | B | B | B |
| Ex. 4B | —/(F) | — | $Al_2O_3$/(H) | 1:9 | (I) | A | A to B | A |
| Ex. 1C | $SiO_2$/(A) | 1:9 | $SiO_2$/(H) | 1:9 | (I) | A to B | B | A to B |
| Ex. 2C | $SiO_2$/(B) | 1:9 | $SiO_2$/(H) | 1:9 | (I) | A | A | A |
| Ex. 3C | $SiO_2$/(D) | 1:9 | $SiO_2$/(H) | 1:9 | (E) | A | A | A |
| Ex. 4C | $Al_2O_3$/(A) | 1:9 | $Al_2O_3$/(H) | 1:9 | (I) | A | A to B | A |
| Ex. 1D | $SiO_2$/(A) | 1:9 | —/(H) | — | (I) | A | A to B | B |
| Ex. 2D | $Al_2O_3$/(A) | 1:9 | —/(H) | — | (I) | B | A to B | A |
| Ex. 1E | $SiO_2$/(A) | 1:9 | $SiO_2$/(H) | 1:9 | (I) | A | A | A to B |
| Ex. 2E | $Al_2O_3$/(A) | 1:9 | $Al_2O_3$/(H) | 1:9 | (I) | A to B | A | A |
| Comp. Ex. 1 | —/(A) | — | —/(H) | — | (I) | C to D | C | C to D |
| Comp. Ex. 2 | —/(F) | — | —/(H) | — | (I) | D | C | D |
| Comp. Ex. 3 | —/(G) | — | —/(H) | — | (I) | | | |

—: No Porous Particles are added.

As shown in Table 1A and Table 1B, all the EL devices of the Examples (that is, EL devices including a hole transport layer which was formed using the semiconductor layer formation material according to the present invention as its main material) were superior to the EL devices of the Comparative Examples in their luminous brightness, maximum luminous efficiency, and half-life.

From this results, it has been confirmed that according to the EL devices of the present invention, a mutual dissolution at the boundary between the adjacent upper and lower layers such as the boundary between the hole transport layer and the light emitting layer and the boundary between the light emitting layer and the electron transport layer is appropriately prevented.

This tendency has been also confirmed in the EL devices of the type that did not have an electron transport layer.

Further, it has been also confirmed that the EL devices formed of high-molecular type hole transport material exhibited excellent luminous brightness, maximum luminous efficiency, and half-life.

What is claimed is:

1. A semiconductor layer formation material, the semiconductor layer including at least a single layer, the semiconductor layer formation material comprising a semiconductor material for forming the single layer, porous particles each having a number of pores, and a dispersion medium, wherein the semiconductor material is in the semiconductor layer formation material in such that at least a part of the semiconductor material is filled in the pores of the porous particles, the semiconductor material is comprised of a compound having at least one polymerizable group, and the compound can be polymerized through its polymerizable groups and is represented by the following general formulas (A1) or (A2):

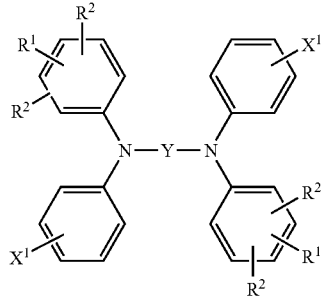
(A1)

wherein two $R^1$s are the same or different and each independently represents a straight-chain alkyl group having 2 to 8 carbon atoms, four $R^2$s are the same or different and each independently represents a hydrogen atom, a methyl group or an ethyl group, Y represents a group containing at least one substituted or unsubstituted aromatic hydrocarbon ring or substituted or unsubstituted heterocycle, and two X's are the same kind of substituent represented by any one of the following general formulas (B1) to (B3), in which the number of carbon atoms of the two $X_1$s are the same as or different from each other; or

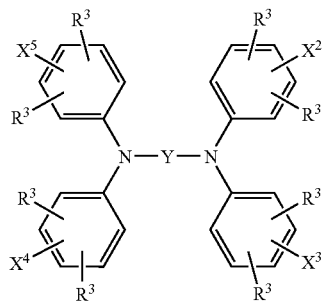
(A2)

wherein eight $R^3$s are the same or different and each independently represents a hydrogen atom, a methyl group, or an ethyl group, Y represents a group containing at least one substituted or unsubstituted aromatic hydrocarbon ring or substituted or unsubstituted heterocycle, and $X^2, X^3, X^4$ and $X^5$ are the same kind of substituent that is represented by any one of the following general formulas (B1) to (B3), in which the number of carbon atoms of $X^2, X^3, X^4$ and $X^5$ are the same as or different from each other,

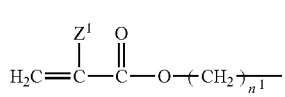
(B1)

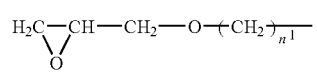
(B2)

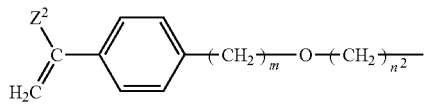
(B3)

wherein $n^1$ is an integer of 3 to 6, $n^2$ is an integer of 3 to 8, m is an integer of 0 to 3, $Z^1$ represents a hydrogen atom or a methyl group, and $Z^2$ represents a hydrogen atom, a methyl group or an ethyl group.

2. The semiconductor layer formation material as claimed in claim 1, wherein when the amount of the porous particles contained in the semiconductor layer formation material is defined as A wt% and the amount of the semiconductor material contained in the semiconductor layer formation material is defined as B wt%, the value A/B satisfies the relation of 0.1 to 9.

3. The semiconductor layer formation material as claimed in claim 1, wherein the porosity of the porous particles is in the range of 20 to 75%.

4. The semiconductor layer formation material as claimed in claim 1, wherein each of the porous particles is formed into a spherical shape or a polyhedron.

5. The semiconductor layer formation material as claimed in claim 1, wherein an average particle size of the porous particles is in the range of 2 to 200 nm.

6. The semiconductor layer formation material as claimed in claim 1, wherein the porous particles are mainly composed of inorganic oxides.

7. The semiconductor layer formation material as claimed in claim 6, wherein the inorganic oxides include at least one or more of $SiO_2$, $Al_2O_3$, ZnO, $SnO_2$, $CeO_2$, ITO, $TiO_2$, CuO, $Fe_2O_3$, CoO, and $Y_2O_3$.

8. A method of manufacturing a semiconductor element, comprising:

a step of forming a semiconductor layer which includes at least a single layer on one surface of a first electrode; and a step of forming a second electrode on a surface of the semiconductor layer which is opposite to the first electrode, wherein the semiconductor layer forming step includes a step of forming a liquid coating layer by supplying a semiconductor layer formation material which comprises a semiconductor material for forming the single layer, porous particles and a dispersion medium and in which the semiconductor material is existed in such a state that at least a part of the semiconductor material is filled in the pores of the porous particles; and a step of removing the dispersion medium from the liquid coating layer, the semiconductor material is comprised of a compound having at least one polymerizable group, and the compound can be polymerized through its polymerizable groups and is represented by the following general formulas (A1) or (A2):

(A1)

wherein two R¹s are the same or different and each independently represents a straight-chain alkyl group having 2 to 8 carbon atoms, and four R²s are the same or different and each independently represents a hydrogen atom, a methyl group or an ethyl group, Y represents a group containing at least one substituted or unsubstituted aromatic hydrocarbon ring or substituted or unsubstituted heterocycle, and two X¹s are the same kind of substituent represented by any one of the following general formulas (B1) to (B3), in which the number of carbon atoms of the two X¹ s are the same as or different from each other, or (A2)

wherein eight R³s are the same or different and each independently represents a hydrogen atom, a methyl group, or an ethyl group, Y represents a group containing at least one substituted or unsubstituted aromatic hydrocarbon ring or substituted or unsubstituted heterocycle, and X², X³, X⁴ and X⁵ are the same kind of substituent which is represented by any one of the following general formulas (B1) to (B3), in which the number of carbon atoms of X², X³, X⁴ and X⁵ are the same as or different from each other, (B1)

(B2)

(B3)

wherein $n^1$ is an integer of 2 to 8,
$n^2$ is an integer of 3 to 8,
m is an integer of 0 to 3,
$Z^1$ represents a hydrogen atom or a methyl group, and
$Z^2$ represents a hydrogen atom, a methyl group or an ethyl group.

9. The semiconductor element manufacturing method as claimed in claim 8 further comprising, after the dispersion medium removing step, a step of polymerizing the polymerizable group of the compound and the polymerizable group of the compound.

10. A method of manufacturing a semiconductor element, comprising:

a step of forming a semiconductor layer which includes at least a single layer on one surface of a first electrode; and a step of forming a second electrode on a surface of the semiconductor layer which is opposite to the first electrode, wherein the semiconductor layer forming step includes a step of supplying a liquid material that comprises a semiconductor material for forming the single layer and a solvent or a dispersion medium to porous particles that are deposited in a coating state so that the semiconductor material is filled in pores of the porous particles and gaps among the porous particles and so that the porous particles exist within the single layer; and a step of removing the dispersion medium or the solvent from the liquid material, the semiconductor material is comprised of a compound having at least one polymerizable group, and the compound can be polymerized through its polymerizable groups and is represented by the following general formulas (A1) or (A2):

(A1)

wherein two R¹s are the same or different and each independently represents a straight-chain alkyl group having 2 to 8 carbon atoms, four R²s are the same or different and each independently represents a hydrogen atom, a methyl group or an ethyl group, Y represents a group containing at least one substituted or unsubstituted aromatic hydrocarbon ring or substituted or unsubstituted heterocycle, and two X¹ s are the same kind of substituent represented by any one of the following general formulas (B1) to (B3), in which the number of carbon atoms of the two X's are the same as or different from each other; or

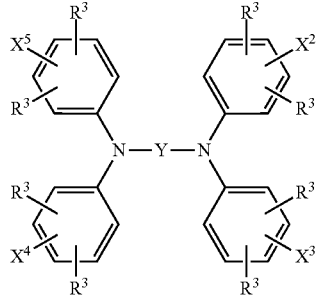
(A2)

wherein eight $R^3$s are the same or different and each independently represents a hydrogen atom, a methyl group, or an ethyl group, Y represents a group containing at least one substituted or unsubstituted aromatic hydrocarbon ring or substituted or unsubstituted heterocycle, and $X^2$, $X^3$, $X^4$ and $X^5$ are the same kind of substituent which is represented by any one of the following general formulas (B1) to (B3), in which the number of carbon atoms of $X^2$ $X^3$, $X^4$ and $X^5$ are the same as or different from each other,

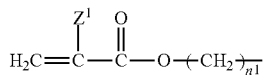
(B1)

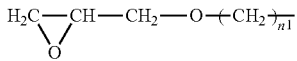
(B2)

-continued

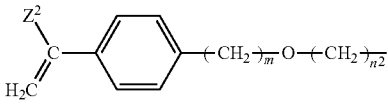
(B3)

wherein $n^1$ is an integer of 3 to 6,
$n^2$ is an integer of 3 to 8,
m is an integer of 0 to 3,
$Z^1$ represents a hydrogen atom or a methyl group, and
$Z^2$ represents a hydrogen atom, a methyl group or an ethyl group.

11. The semiconductor element manufacturing method as claimed in claim 10, further comprising, after the dispersion medium removing step, a step of polymerizing the polymerizable group of the compound and the polymerizable group of the compound.

12. A semiconductor element, comprising:
a first electrode;
a second electrode; and
a semiconductor layer including at least a single layer, the semiconductor layer being provided between the first electrode and the second electrode, the semiconductor layer is formed of the semiconductor layer formation material defined in claim 1,
wherein the single layer comprises porous particles and a semiconductor material for forming the single layer filled in pores of the porous particles and gaps among the porous particles.

13. The semiconductor element as claimed in claim 12, wherein the single layer is a hole transport layer.

14. The semiconductor element as claimed in claim 12, wherein the single layer is a light emitting layer.

15. An electronic device provided with the semiconductor element defined in claim 12.

16. Electronic equipment provided with the electronic device defined in claim 15.

* * * * *